United States Patent
Pyo et al.

(10) Patent No.: US 10,249,666 B2
(45) Date of Patent: Apr. 2, 2019

(54) IMAGE SENSORS INCLUDING SHIFTED ISOLATION STRUCTURES

(71) Applicant: Samsung Electronics Co., Ltd., Suwon-si, Gyeonggi-do (KR)

(72) Inventors: Junghyung Pyo, Seoul (KR); BumSuk Kim, Hwaseong-si (KR); Kyungho Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 8 days.

(21) Appl. No.: 15/605,076

(22) Filed: May 25, 2017

(65) Prior Publication Data
US 2018/0047766 A1 Feb. 15, 2018

(30) Foreign Application Priority Data

Aug. 9, 2016 (KR) .................. 10-2016-0101461

(51) Int. Cl.
*H01L 27/146* (2006.01)

(52) U.S. Cl.
CPC .... *H01L 27/1463* (2013.01); *H01L 27/14605* (2013.01); *H01L 27/14627* (2013.01); *H01L 27/14609* (2013.01); *H01L 27/14621* (2013.01); *H01L 27/14643* (2013.01)

(58) Field of Classification Search
CPC ......... H01L 27/14609; H01L 27/14621; H01L 27/14627; H01L 27/1463; H01L 27/14605
See application file for complete search history.

(56) References Cited

U.S. PATENT DOCUMENTS

| | | | |
|---|---|---|---|
| 8,493,452 B2 | 7/2013 | Kikuchi | |
| 8,552,353 B2 | 10/2013 | Kobayashi et al. | |
| 8,860,099 B2 | 10/2014 | Tatani et al. | |
| 9,093,349 B2 | 7/2015 | Furukawa et al. | |
| 9,287,309 B2 | 3/2016 | Choi et al. | |
| 9,288,380 B2 | 3/2016 | Nomura | |
| 9,942,461 B2* | 4/2018 | Kim | H01L 27/14607 |
| 9,998,691 B2* | 6/2018 | Numata | H01L 27/14605 |
| 10,021,328 B2* | 7/2018 | Takada | H04N 5/378 |
| 2012/0153418 A1* | 6/2012 | Nakadate | H01L 27/14605 257/432 |
| 2012/0268634 A1* | 10/2012 | Fukuda | H01L 27/14605 348/302 |
| 2014/0239362 A1 | 8/2014 | Koo et al. | |
| 2015/0228687 A1* | 8/2015 | Numata | H01L 27/14627 257/432 |
| 2015/0263054 A1* | 9/2015 | Chien | H01L 27/14623 257/292 |
| 2015/0372048 A1 | 12/2015 | Tsuboi et al. | |
| 2017/0301718 A1* | 10/2017 | Chou | H01L 27/14645 |
| 2017/0310913 A1* | 10/2017 | Takada | H04N 5/3696 |
| 2018/0047775 A1* | 2/2018 | Murase | H01L 27/14645 |
| 2018/0269245 A1* | 9/2018 | Mlinar | H01L 27/14607 |

FOREIGN PATENT DOCUMENTS

KR    10-2017-0043140     4/2017

* cited by examiner

*Primary Examiner* — Victoria K Hall
(74) *Attorney, Agent, or Firm* — Myers Bigel, P.A.

(57) ABSTRACT

Image sensors are provided. An image sensor includes a semiconductor substrate including a pixel region. The image sensor includes first and second photoelectric conversion elements in the pixel region. The image sensor includes an isolation region between the first and second photoelectric conversion elements. The isolation region is off-center with respect to the pixel region.

20 Claims, 28 Drawing Sheets

FIG. 4A

| B | G | B | G | B | G | B | G |
|---|---|---|---|---|---|---|---|
| G | R | G | R | G | R | G | R |
| B | G | B | G | B | G | B | G |
| G | R | G | R | G | R | G | R |

FIG. 4B

| G | R | G | R | G | R | G | R |
|---|---|---|---|---|---|---|---|
| B | W | B | W | B | W | B | W |
| G | R | G | R | G | R | G | R |
| B | W | B | W | B | W | B | W |

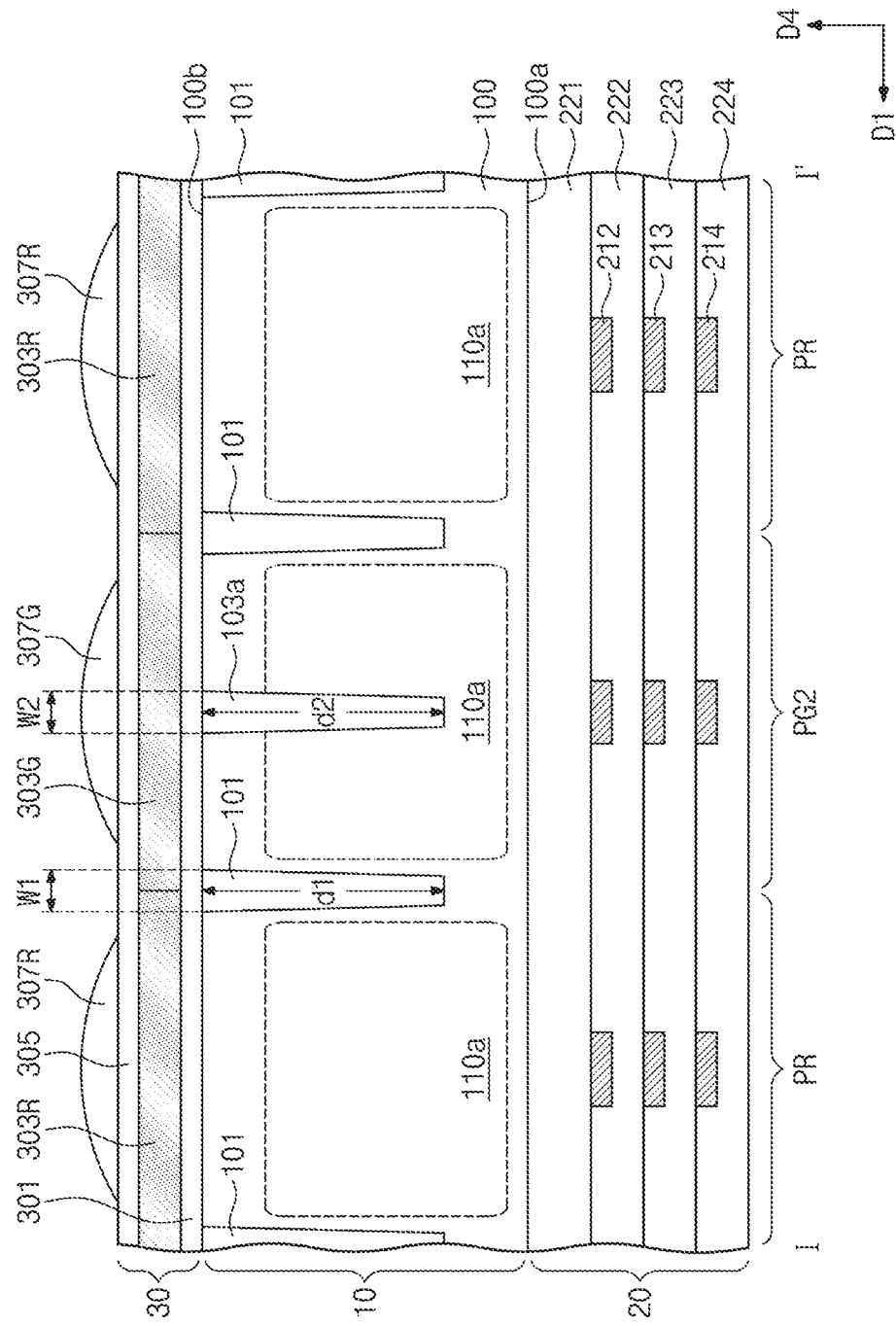

IMAGE SENSORS INCLUDING SHIFTED ISOLATION STRUCTURES

CROSS-REFERENCE TO RELATED APPLICATION

This U.S. non-provisional patent application claims priority under 35 U.S.C. § 119 to Korean Patent Application No. 10-2016-0101461, filed on Aug. 9, 2016, in the Korean Intellectual Property Office, the disclosure of which is hereby incorporated by reference herein in its entirety.

BACKGROUND

The present disclosure relates to image sensors. An image sensor converts an optical image into an electrical signal. As computer and communication industries have developed, high-performance image sensors have been increasingly demanded in various fields such as a digital camera, a camcorder, a personal communication system (PCS), a game console, a security camera, and a medical micro camera. Thus, it may be beneficial to increase or improve performance of an imaging apparatus or an image sensor included in the imaging apparatus.

SUMMARY

Example embodiments of present inventive concepts may provide an image sensor having an improved optical characteristic.

An image sensor, according to some embodiments, may include a semiconductor substrate including a first pixel region and a second pixel region. The image sensor may include a first isolation structure in the semiconductor substrate to define the first and second pixel regions. The image sensor may include a first photoelectric conversion element and a second photoelectric conversion element in each of the first and second pixel regions. The image sensor may include a second isolation structure between the first and second photoelectric conversion elements in the first pixel region. The image sensor may include an isolation dopant region between the first and second photoelectric conversion elements in the second pixel region. A center of the second isolation structure may be shifted relative to a center of the first pixel region when viewed from a plan view. The first pixel region may be one of a plurality of first pixel regions, and the second pixel region may be one of a plurality of second pixel regions. The first pixel regions and the second pixel regions may be alternately arranged along a first direction.

An image sensor, according to some embodiments, may include a semiconductor substrate including a pixel region. The image sensor may include a micro lens on the pixel region. The image sensor may include a first isolation structure in the semiconductor substrate to define the pixel region. The image sensor may include a first photoelectric conversion element and a second photoelectric conversion element in the pixel region. The image sensor may include a second isolation structure between the first and second photoelectric conversion elements in the pixel region. A center of the micro lens may be shifted from a center of the pixel region when viewed from a plan view. A center of the second isolation structure may be shifted from the center of the pixel region when viewed from a plan view.

An image sensor, according to some embodiments, may include a semiconductor substrate that includes a first pixel region in a first region and a second pixel region in a second region. The image sensor may include a first isolation structure in the semiconductor substrate to define the first and second pixel regions. The image sensor may include a first photoelectric conversion element and a second photoelectric conversion element in each of the first and second pixel regions. The image sensor may include a second isolation structure between the first and second photoelectric conversion elements in the first pixel region. The image sensor may include a third isolation structure between the first and second photoelectric conversion elements in the second pixel region. The first region may be at a center of the semiconductor substrate. The first region may be spaced apart from the second region in a first direction. A center of the second isolation structure may be substantially aligned with a center of the first pixel region when viewed from a plan view. Moreover, a center of the third isolation structure may be shifted from a center of the second pixel region in the first direction when viewed from a plan view.

An image sensor, according to some embodiments, may include a semiconductor substrate including a plurality of pixel regions. The image sensor may include first and second photoelectric conversion regions in one of the plurality of pixel regions. The image sensor may include an isolation region extending in the semiconductor substrate between the first and second photoelectric conversion regions in the one of the plurality of pixel regions. The image sensor may include a lens that overlaps a center of the isolation region. The center of the isolation region and a center of the lens may be offset from a center of the one of the plurality of pixel regions.

BRIEF DESCRIPTION OF THE DRAWINGS

Example embodiments will be more clearly understood from the following detailed description taken in conjunction with the accompanying drawings.

FIGS. 4A, 4B, 4C and 4D are plan views illustrating color filter arrays of image sensors according to some embodiments of present inventive concepts.

FIGS. 7A, 7B, and 7C are cross-sectional views taken along lines I-I', II-II', and III-III' of FIG. 6, respectively.

DETAILED DESCRIPTION

Figure 1:
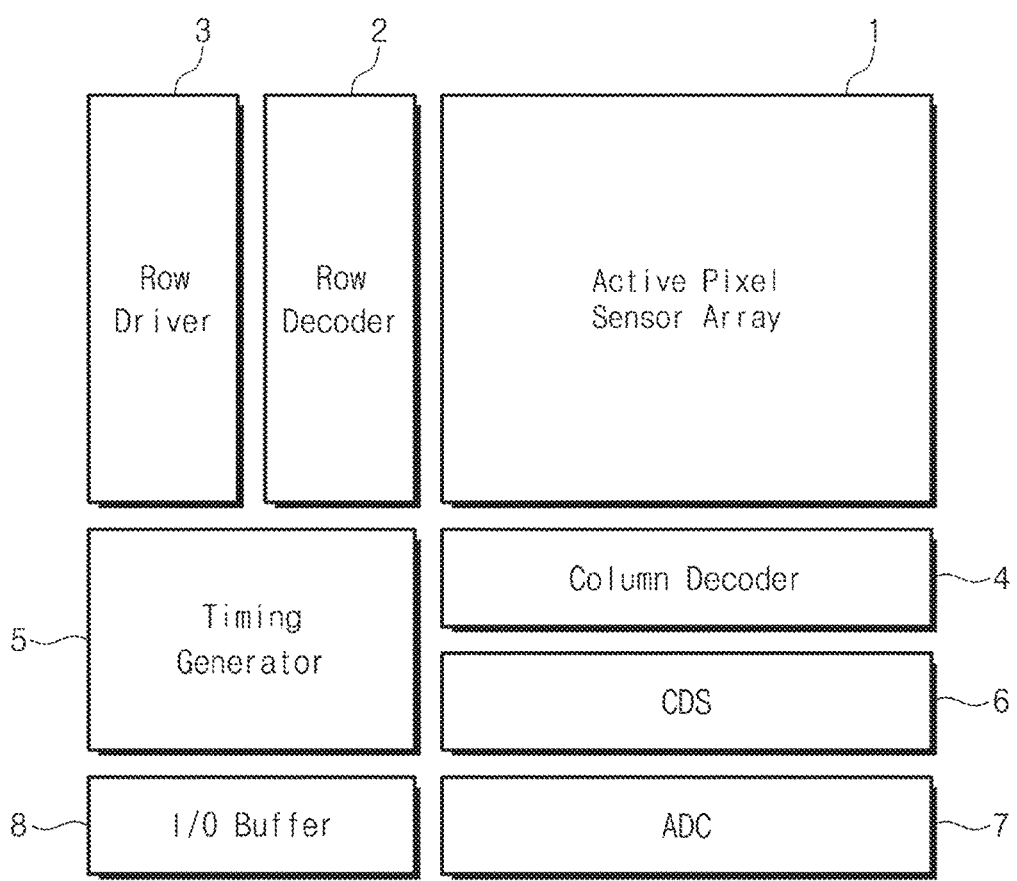
FIG. 1 is a schematic block diagram illustrating an image sensor according to some embodiments of present inventive concepts.

FIG. 1 is a schematic block diagram illustrating an image sensor according to some embodiments of the inventive concepts.

Referring to FIG. 1, an image sensor may include an active pixel sensor array 1, a row decoder 2, a row driver 3, a column decoder 4, a timing generator 5, a correlated double sampler (CDS) 6, an analog-to-digital converter (ADC) 7, and an input/output (I/O) buffer 8.

The active pixel sensor array 1 may include a plurality of unit pixels two-dimensionally arranged and may convert optical signals into electrical signals. The active pixel sensor array 1 may be driven by a plurality of driving signals (e.g., a pixel selection signal, a reset signal, and a charge transfer signal) provided from the row driver 3. In addition, the converted electrical signals may be provided to the correlated double sampler 6.

According to some embodiments of the inventive concepts, the image sensor may perform an auto-focusing operation by phase difference detection of light incident on the active pixel sensor array 1. Each of the unit pixels of the active pixel sensor array 1 may output a focus signal corresponding to a phase difference between lights incident on a pair of photoelectric conversion elements. To perform the auto-focusing operation, the focus signal may be used as a signal that adjusts a position of a lens of an imaging apparatus including the image sensor.

The row driver 3 may provide a plurality of driving signals for driving a plurality of unit pixels to the active pixel sensor array 1 in response to signals decoded in the row decoder 2. When the unit pixels are arranged in a matrix form, the driving signals may be provided to each row of the matrix.

The timing generator 5 may provide timing signals and control signals to the row decoder 2 and the column decoder 4.

The correlated double sampler 6 may receive electrical signals generated from the active pixel sensor array 1 and may hold and sample the received electrical signals. The correlated double sampler 6 may doubly sample a specific noise level and a signal level of the electrical signal to output a difference level corresponding to a difference between the noise level and the signal level.

The analog-to-digital converter 7 may convert an analog signal, which corresponds to the difference level outputted from the correlated double sampler 6, into a digital signal.

The I/O buffer 8 may latch the digital signals and may sequentially output the latched digital signals to an image signal processing part in response to signals decoded in the column decoder 4.

Figure 2:
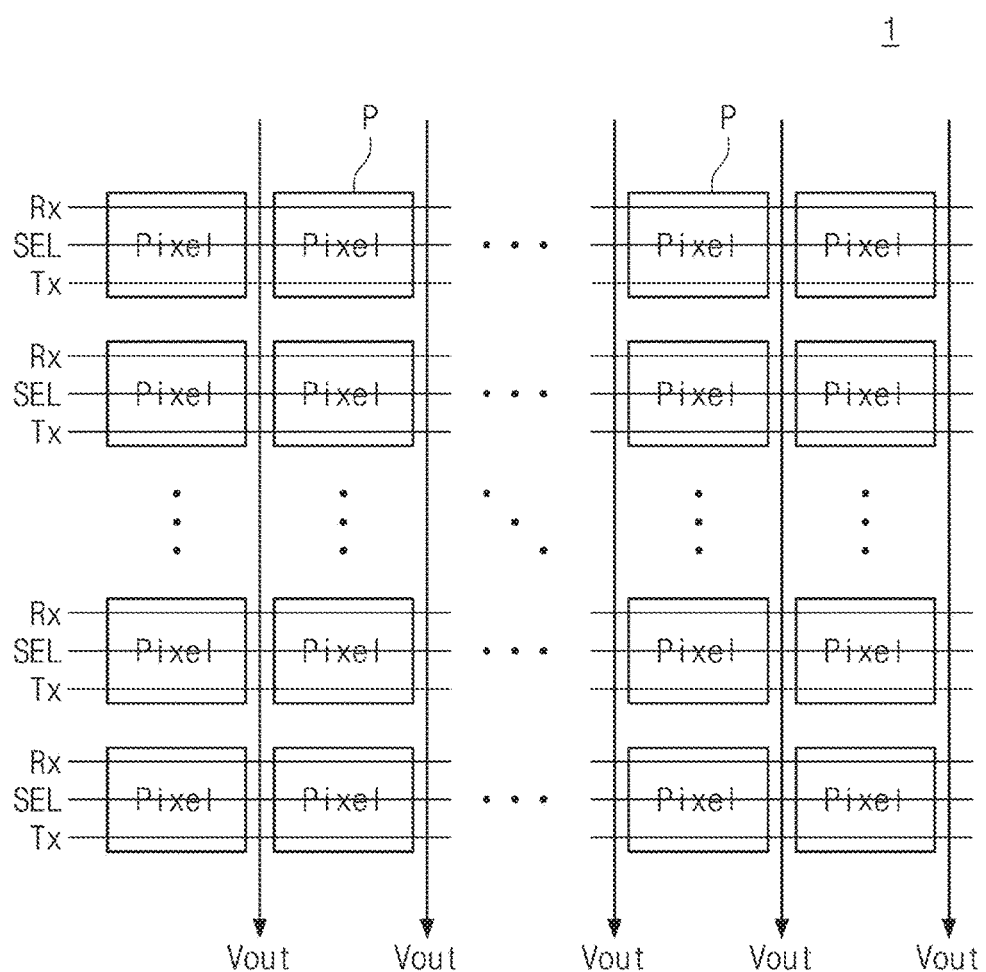
FIG. 2 is a schematic circuit diagram illustrating an active pixel sensor array of an image sensor according to some embodiments of present inventive concepts.

FIG. 2 is a schematic circuit diagram illustrating an active pixel sensor array of an image sensor according to some embodiments of present inventive concepts.

Referring to FIG. 2, an active pixel sensor array 1 may include a plurality of unit pixels P two-dimensionally arranged along rows and columns. An electrical signal may be generated by incident light in each of the unit pixels P. The unit pixels P may be driven by driving signals transmitted through a pixel selection line SEL, a charge transfer line Tx, and a reset line Rx which are connected to the unit pixels P. In addition, the electrical signals converted in the unit pixels P may be provided to a control circuit through output lines Vout.

Figure 3:
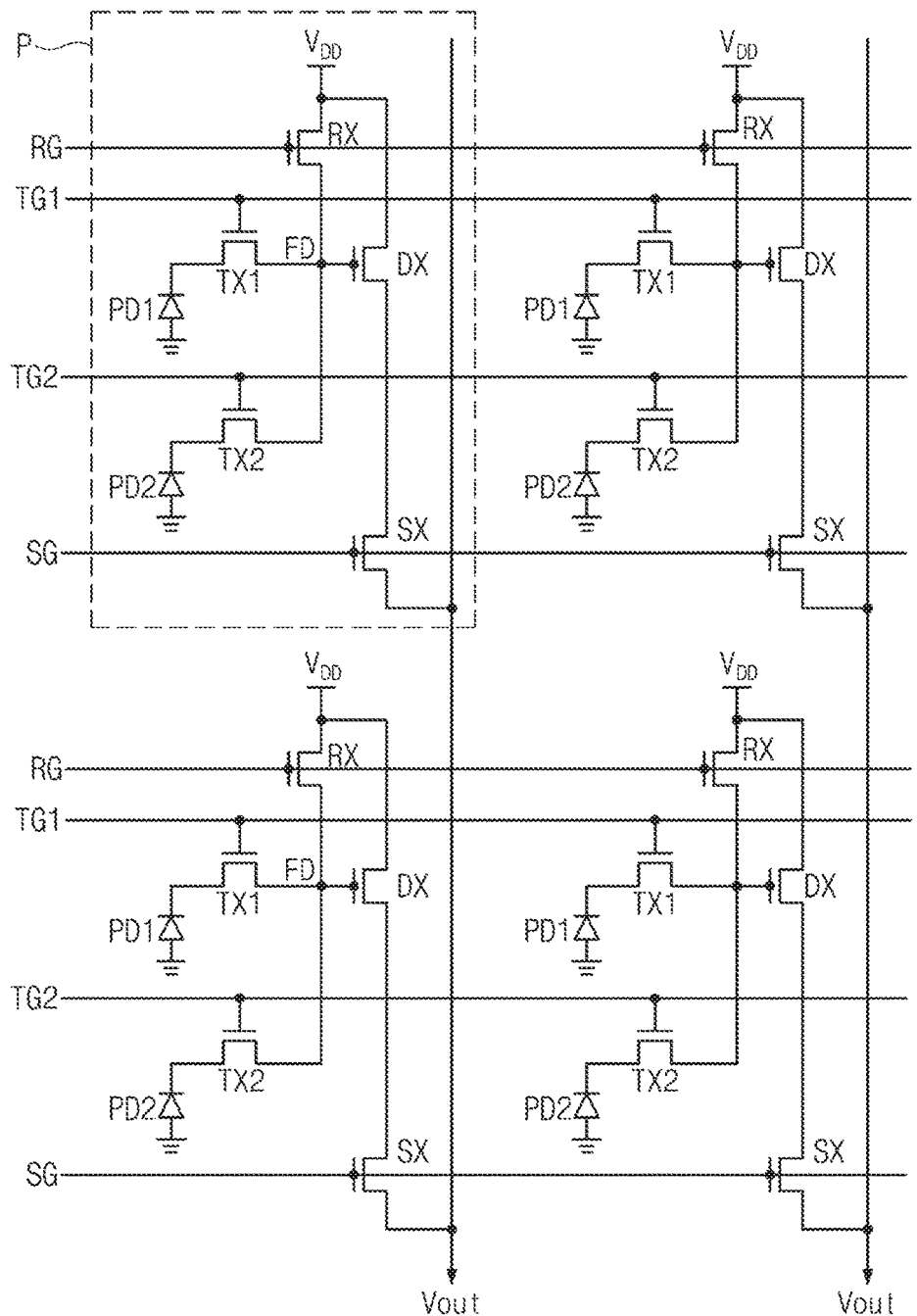
FIG. 3 is a circuit diagram illustrating an active pixel sensor array of an image sensor according to some embodiments of present inventive concepts.

FIG. 3 is a circuit diagram illustrating an active pixel sensor array of an image sensor according to some embodiments of present inventive concepts.

Referring to FIG. 3, an active pixel sensor array 1 may include a plurality of unit pixels P. The unit pixels P may be arranged in a matrix form along a row direction and a column direction. Each unit pixel P may include first and second photoelectric conversion elements PD1 and PD2, first and second transfer transistors TX1 and TX2, and logic transistors RX, SX, and DX. Here, the logic transistors may include a reset transistor RX, a selection transistor SX, and a drive transistor or source follower transistor DX. Gate electrodes of the first and second transfer transistors TX1 and TX2, a gate electrode of the reset transistor RX, and a gate electrode of the selection transistor SX may be connected to driving signal lines TG1, TG2, RG, and SG, respectively.

The first transfer transistor TX1 may include a first transfer gate TG1 and the first photoelectric conversion element PD1, and the second transfer transistor TX2 may include a second transfer gate TG2 and the second photoelectric conversion element PD2. In addition, the first and second transfer transistors TX1 and TX2 may share a charge detection node (i.e., a floating diffusion region) FD.

The first and second photoelectric conversion elements PD1 and PD2 may generate and accumulate photocharges in proportion to the amount of light incident on the active pixel sensor array 1. Each of the first and second photoelectric conversion elements PD1 and PD2 may include a photodiode, a photo transistor, a photo gate, a pinned photodiode (PPD), or any combination thereof.

The first and second transfer gates TG1 and TG2 may transfer charges, which are accumulated in the first and second photoelectric conversion elements PD1 and PD2, into the charge detection node (i.e., the floating diffusion region) FD. Signals which are complementary to each other may be applied to the first and second transfer gates TG1 and TG2. In other words, charges may be transferred from one of the first and second photoelectric conversion elements PD1 and PD2 into the charge detection node FD.

The charge detection node FD may receive the charges generated in the first and second photoelectric conversion elements PD1 and PD2 and may cumulatively store the received charges. The drive transistor DX may be controlled according to the amount of the photocharges accumulated in the charge detection node FD.

The reset transistor RX may periodically reset the charges accumulated in the charge detection node FD. In detail, a drain electrode of the reset transistor RX may be connected to the charge detection node FD, and a source electrode of the reset transistor RX may be connected to a power voltage VDD. When the reset transistor RX is turned-on, the power voltage VDD connected to the source electrode of the reset transistor RX may be transmitted to the charge detection node FD. Thus, the charges accumulated in the charge detection node FD may be discharged to reset the charge detection node FD when the reset transistor RX is turned-on.

The drive transistor DX and a constant current source may constitute a source follower buffer amplifier. The constant current source may be disposed outside the unit pixel PX. The drive transistor DX may amplify a potential variation of the charge detection node FD and may provide the amplified potential variation to the output line Vout.

The selection transistor SX may select the unit pixels P of a row to be sensed. When the selection transistor SX is turned-on, the power voltage VDD connected to a drain electrode of the drive transistor DX may be transmitted to a drain electrode of the selection transistor SX.

FIGS. 4A to 4D are plan views illustrating color filter arrays of image sensors according to some embodiments of present inventive concepts.

Referring to FIG. 4A, in an active pixel sensor array 1, color filters may be disposed to correspond to the unit pixels, respectively. Each of the unit pixels may include one of red, green, and blue color filters R, G, and B. In other words, the unit pixels may include red pixels including the red color filters R, blue pixels including the blue color filters B, and green pixels including the green color filters G. The red color filter R may transmit red light among visible light in the red pixel, and the photoelectric conversion element of the red pixel may generate photoelectrons corresponding to the red light. The blue color filter B may transmit blue light among visible light in the blue pixel, and the photoelectric conversion element of the blue pixel may generate photoelectrons corresponding to the blue light. The green color filter G of the green pixel may transmit green light among visible light, and the photoelectric conversion element of the green pixel may generate photoelectrons corresponding to the green light. Meanwhile, in some embodiments, the unit pixels of the active pixel sensor array 1 may include magenta (Mg), yellow (Y), and cyan (Cy) color filters.

In some embodiments, the color filters R, G, and B may be arranged in a Bayer pattern type in which the number of the green color filters G is two times more than the number of the red color filters R or the number of the blue color filters B. The color filters R, G, and B arranged in a 2×2 matrix form may constitute one color filter group in the Bayer pattern. The Bayer pattern may include a plurality of the color filter groups. Each of the color filter groups may include two green color filters G arranged in a diagonal direction, and red and blue color filters R and B arranged in another diagonal direction. In other words, each of the red and blue color filters R and B may be disposed between the green color filters G adjacent to each other in the Bayer pattern. The color filter groups of the Bayer pattern may be repeatedly arranged in a first direction D1 and a second direction D2.

Referring to FIG. 4B, each of unit pixels of an active pixel sensor array 1 may include one of red, greed, blue, and white color filters R, G, B, and W. In some embodiments, the white color filter W may be a transparent color filter transmitting light of a visible wavelength band. The red, green, blue, and white color filters R, G, B, and W may be arranged in a 2×2 matrix form to constitute one color filter group, and a plurality of the color filter groups may be repeatedly arranged in a first direction D1 and a second direction D2.

Figures 4C, 4D:
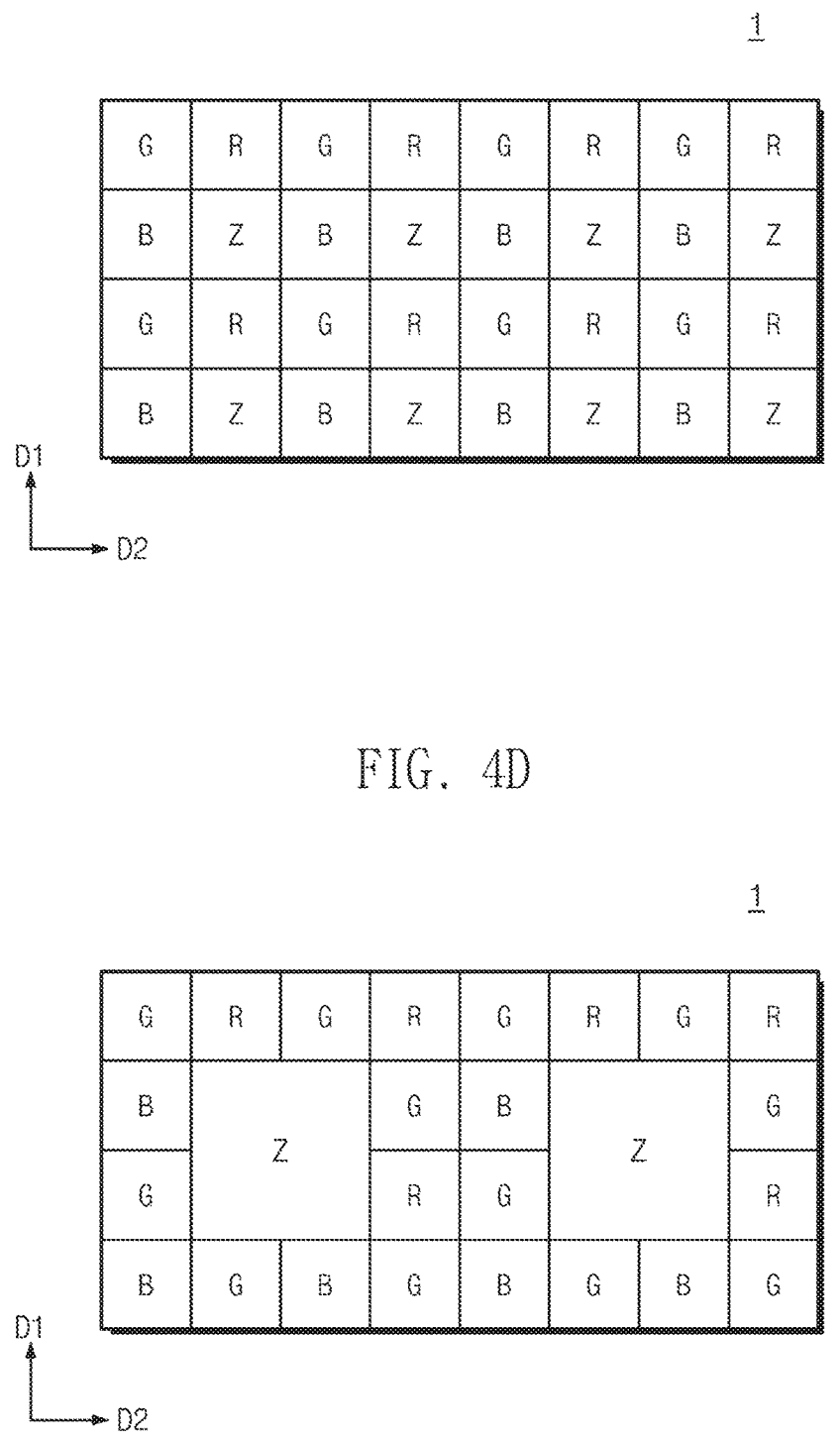

Referring to FIG. 4C, an active pixel sensor array 1 may include color pixels and depth pixels. Each of the color pixels may include one of red, green, and blue color filters R, G, and B. Each of the depth pixels may include an infrared filter Z filtering infrared light.

The red, green, and blue color filters R, G, and B and the infrared filter Z may be arranged in a 2×2 matrix form to constitute one filter group, and a plurality of the filter groups may be repeatedly arranged in a first direction D1 and a second direction D2. In some embodiments, the depth pixel including the infrared filter Z may be disposed between adjacent two of the color pixels including the color filters R, G, and B. Areas of the unit pixels including the filters R, G, B, and Z may be substantially equal to each other.

In each of the filter groups, lights of which wavelength bands are different from each other may be incident on the unit pixels R, G, B, and Z. As described above, the color pixels may filter visible light to generate photoelectrons. The infrared filter Z of the depth pixel may transmit infrared light, and the photoelectric conversion element of the depth pixel may generate photoelectrons corresponding to the infrared light. The depth pixels may sense the infrared light to detect a distance between an imaging apparatus and a subject, and a three-dimensional image may be realized using the depth pixels.

Referring to FIG. 4D, an active pixel sensor array 1 may include color pixels and depth pixels. Each of the color pixels may include one of red, green, and blue color filters R, G, and B, and each of the depth pixels may include an infrared filter Z. The color pixels may be arranged along a first direction D1 and a second direction D2 and may be disposed around the depth pixel. An area of the depth pixel including the infrared filter Z may be greater than an area of each of the color pixels including the color filters R, G, and B.

Figure 5A:
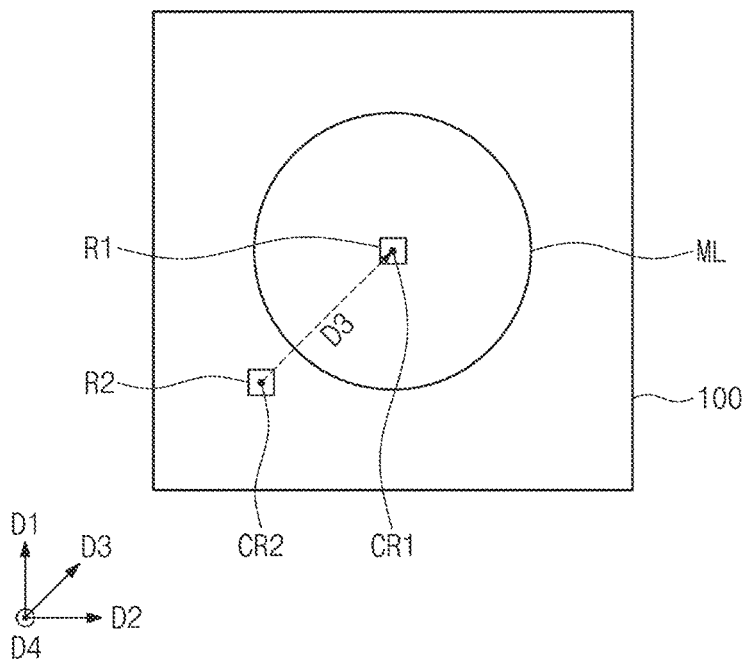
FIG. 5A is a plan view illustrating an image sensor according to some embodiments of present inventive concepts.
Figure 5B:
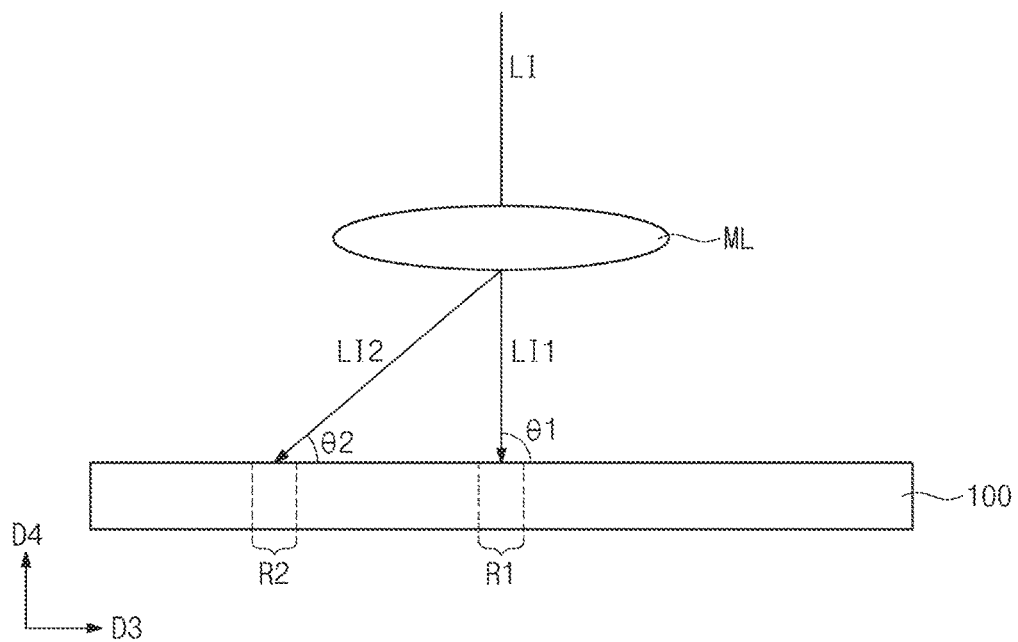
FIG. 5B is a cross-sectional view taken along a third direction D3 of FIG. 5A.

FIG. 5A is a plan view illustrating an image sensor according to some embodiments of present inventive concepts, and FIG. 5B is a cross-sectional view taken along a third direction D3 of FIG. 5A.

Referring to FIGS. 5A and 5B, an image sensor according to some embodiments of present inventive concepts may include a semiconductor substrate 100 and a module lens ML disposed on or above the semiconductor substrate 100. The module lens ML may be aligned with a center of the semiconductor substrate 100 when viewed from a plan view. The active pixel sensor array described above with reference to FIGS. 1 to 3 may be formed on the semiconductor substrate 100. The active pixel sensor array formed on the semiconductor substrate 100 will be described later in more detail.

Meanwhile, the semiconductor substrate 100 may include a first region R1 and a second region R2. The first region R1 may be disposed at the center of the semiconductor substrate 100, and the second region R2 may be spaced apart from the center of the semiconductor substrate 100. In detail, the center (i.e., the first region R1) of the semiconductor substrate 100 may be spaced apart from the second region R2 in a third direction D3. In other words, a center CR1 of the first region R1 may be spaced apart from a center CR2 of the second region R2 in the third direction D3.

Light LI transmitted through the module lens ML may be incident on the active pixel sensor array of the semiconductor substrate 100. First light LI1 incident on the first region R1 may have a first incident angle $\theta 1$ that is a substantially right angle. This is because the first region R1 is disposed at the center of the semiconductor substrate 100. Meanwhile, second light LI2 incident on the second region R2 may have a second incident angle $\theta 2$. The second incident angle $\theta 2$ may be smaller than the first incident angle $\theta 1$. This is because the second region R2 is spaced apart from the center of the semiconductor substrate 100.

Figure 6:
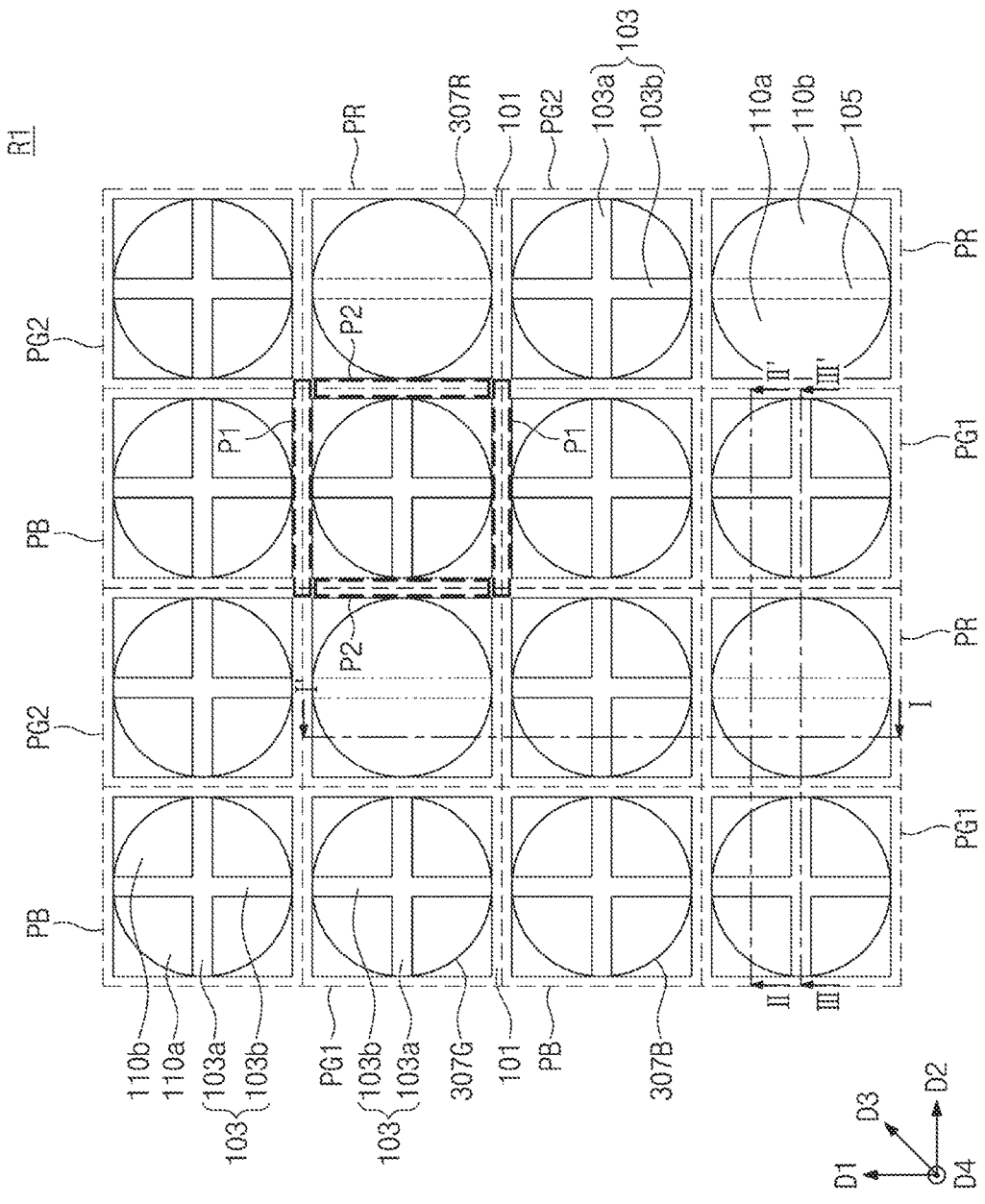
FIGS. 6 and 8 are plan views illustrating an image sensor according to some embodiments of present inventive concepts.
Figure 7B:
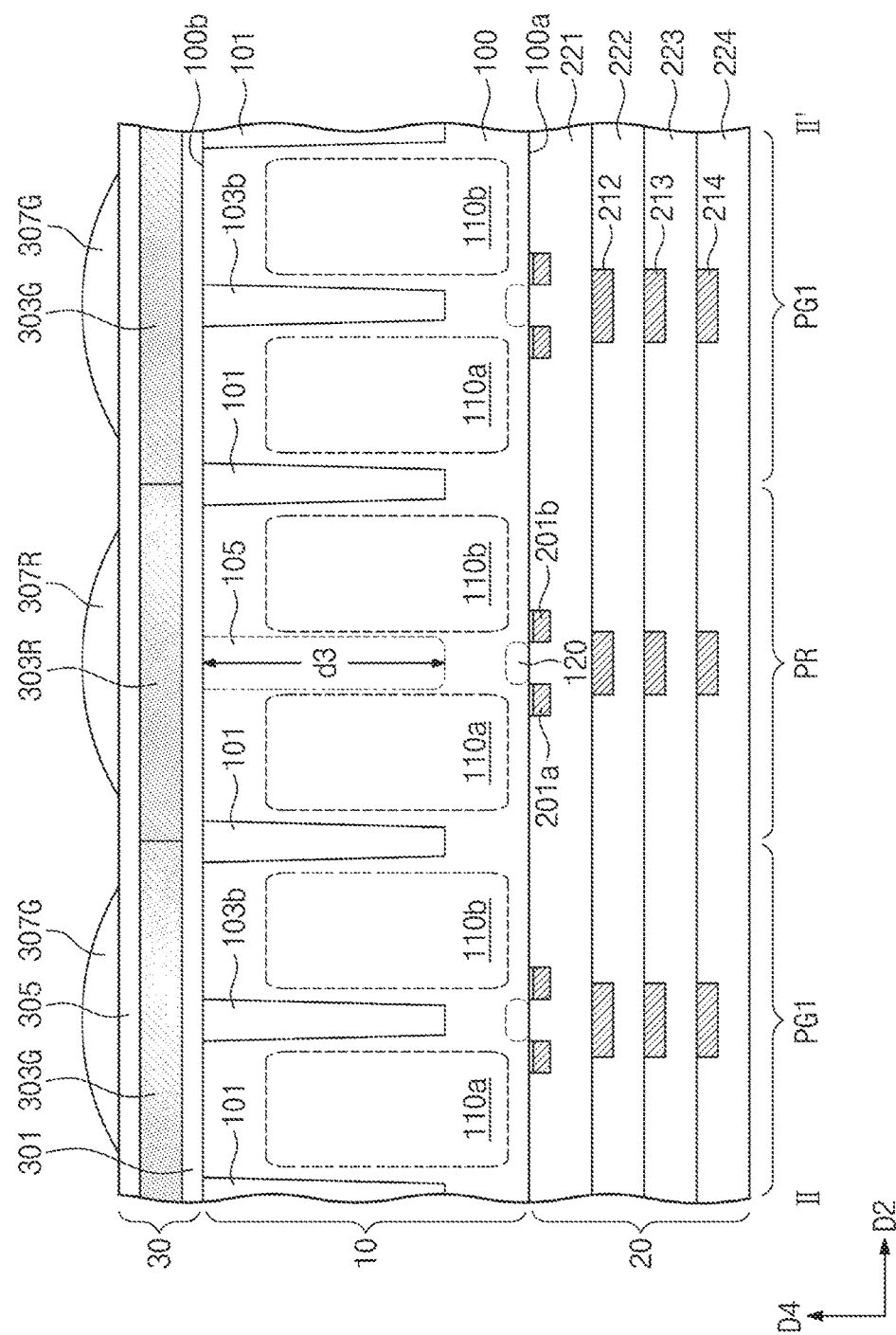
Figure 7C:
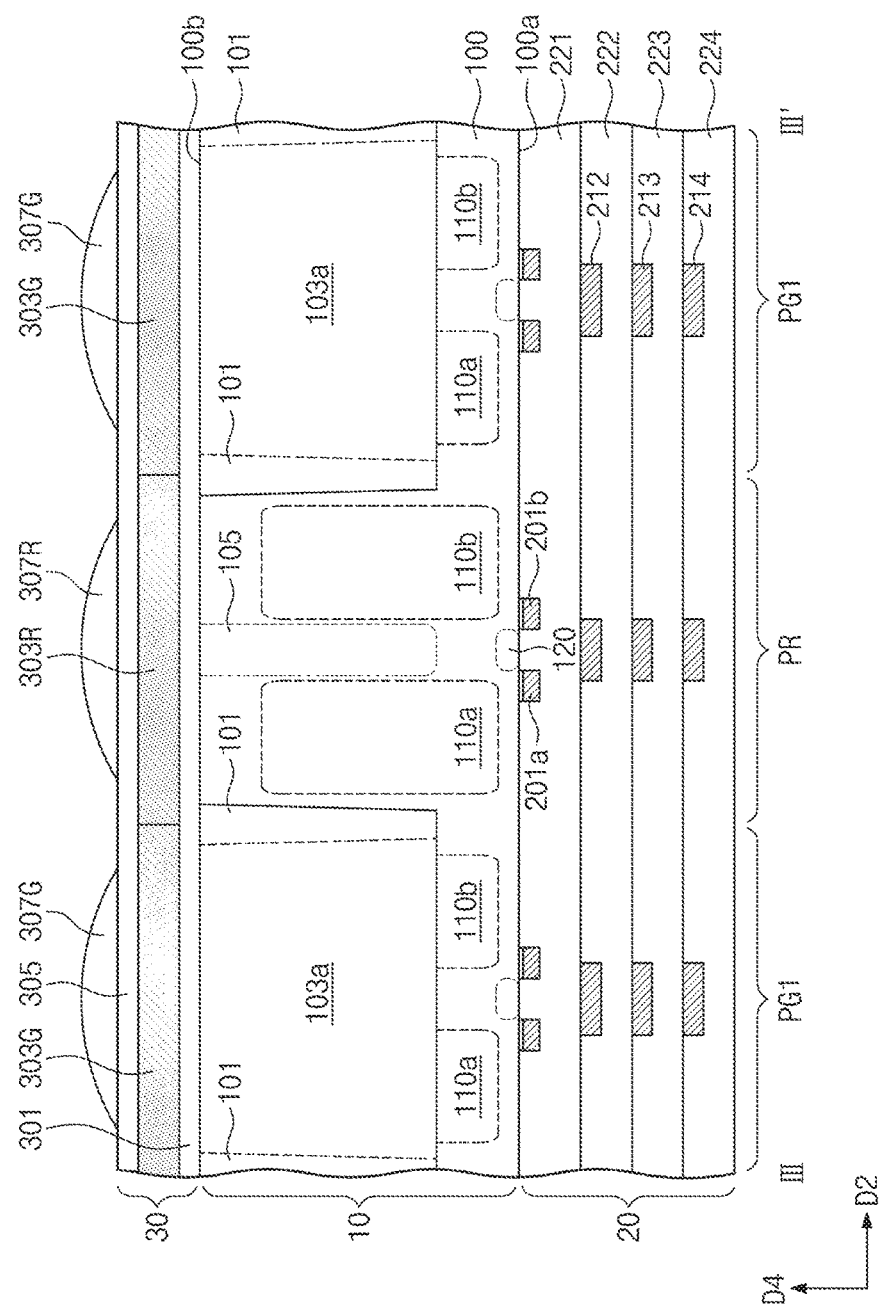
Figure 8:
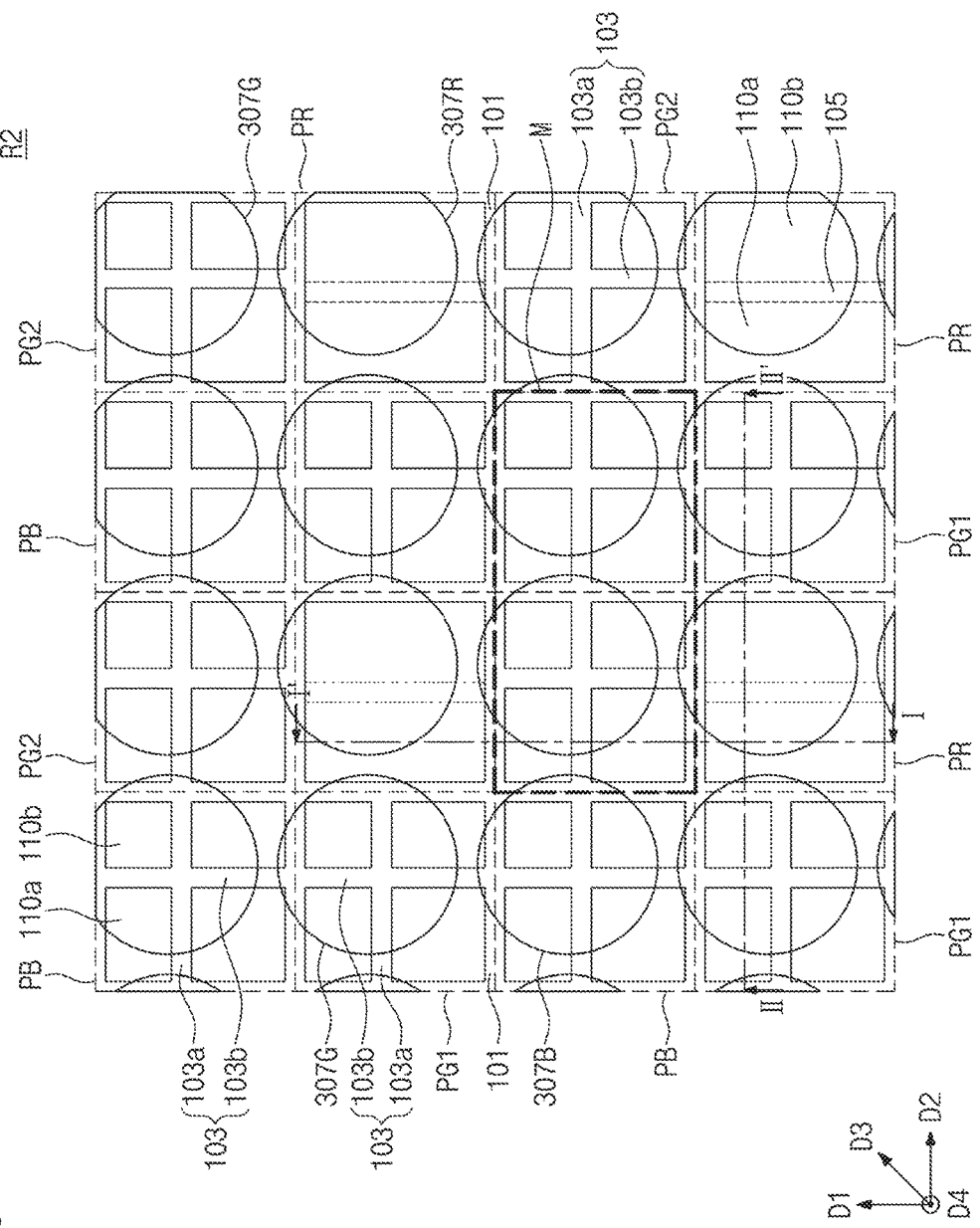
Figure 9A:
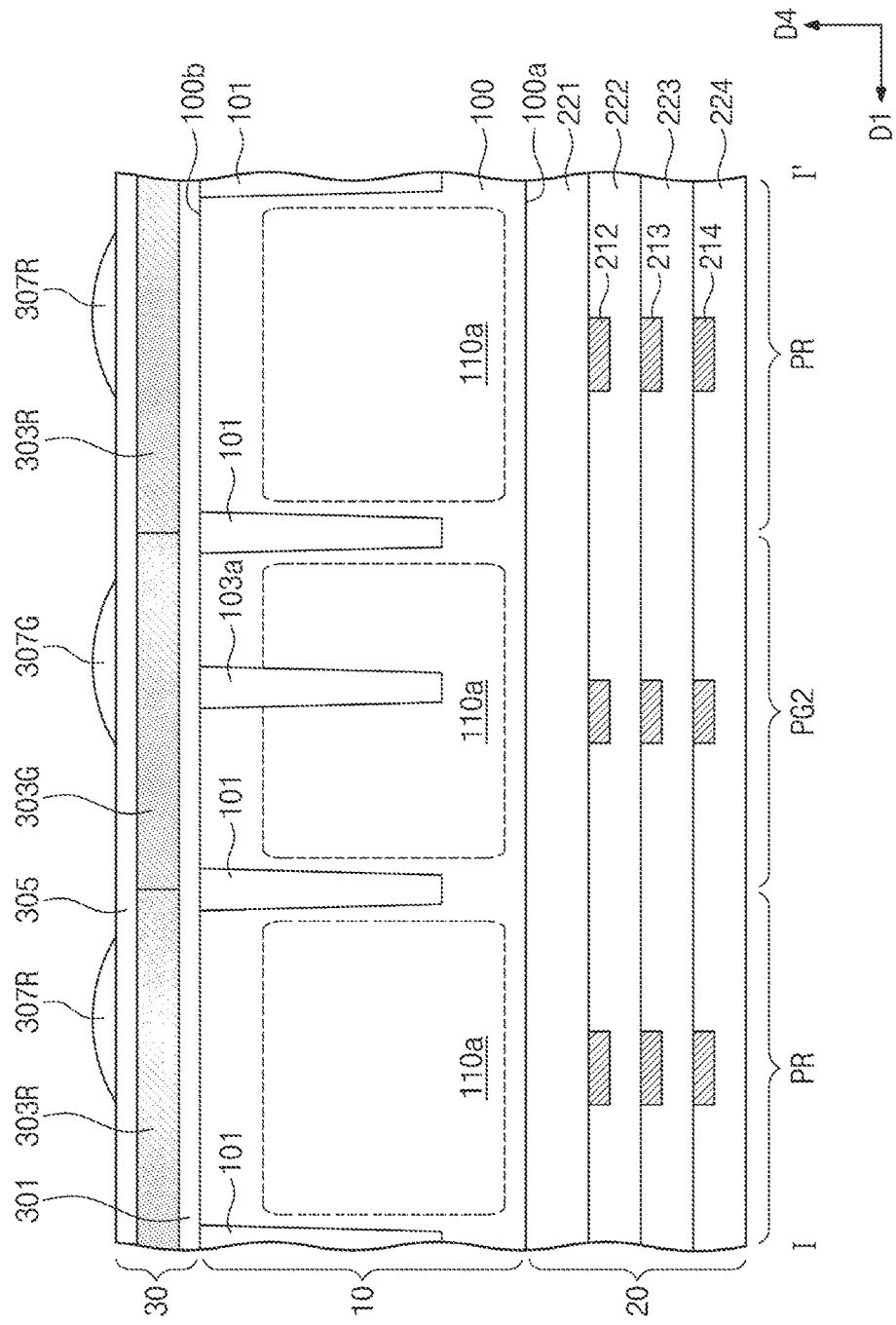
FIGS. 9A and 9B are cross-sectional views taken along lines I-I' and II-II' of FIG. 8, respectively.
Figure 9B:
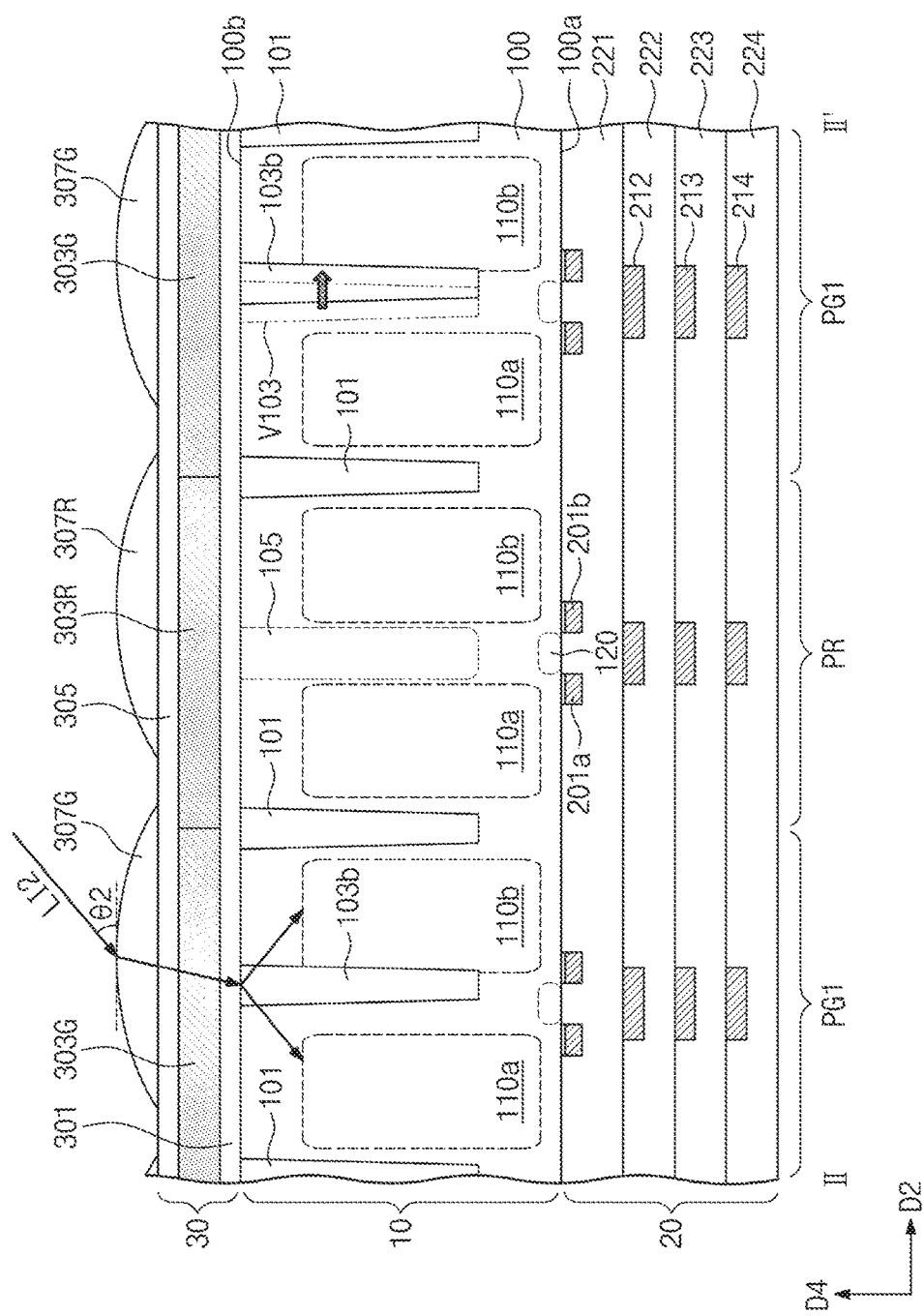
Figure 10:
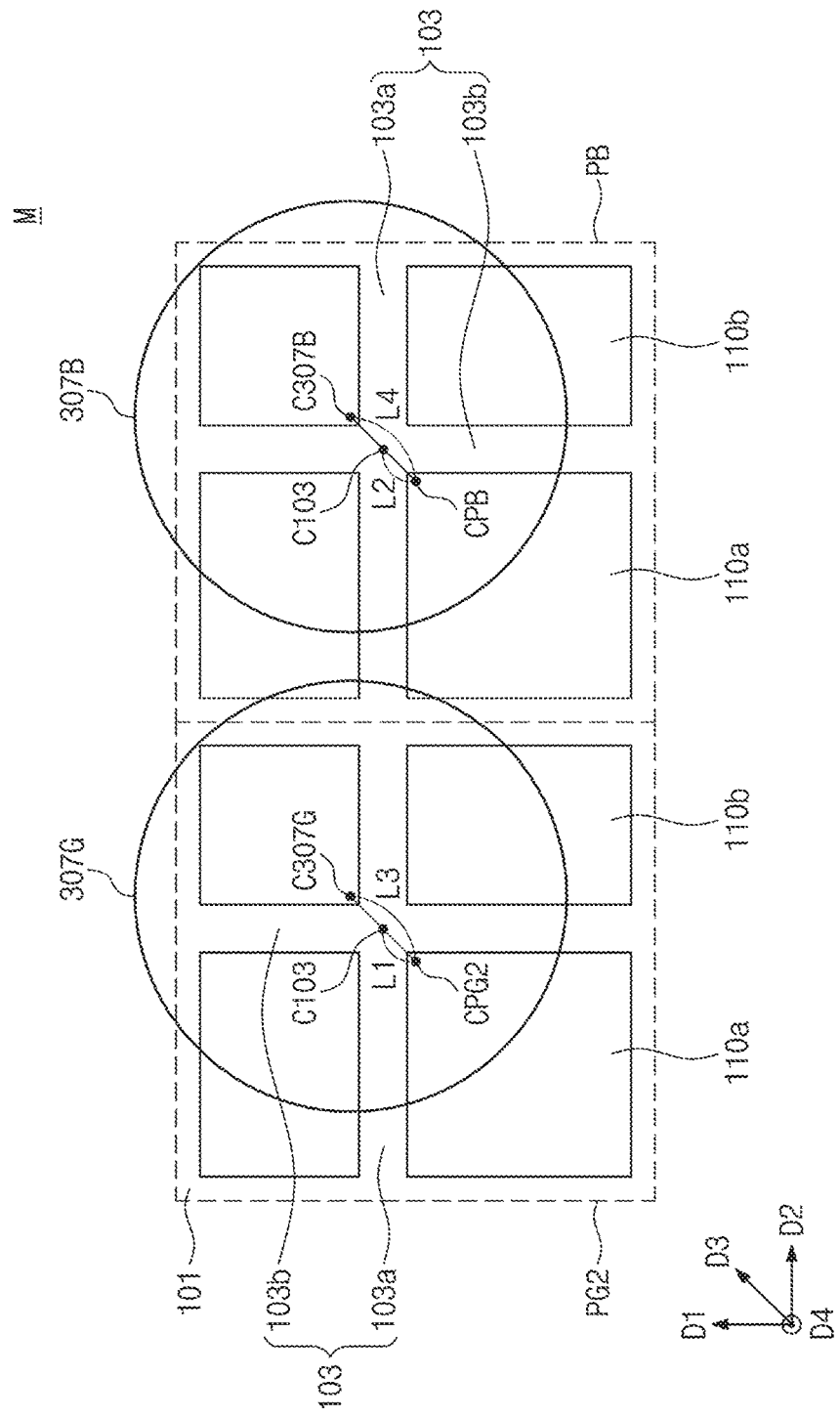
FIG. 10 is an enlarged plan view of a region 'M' of FIG. 8.

FIGS. 6 and 8 are plan views illustrating an image sensor according to some embodiments of present inventive concepts. FIG. 6 is an enlarged plan view of the first region R1 of FIG. 5A, and FIG. 8 is an enlarged plan view of the second region R2 of FIG. 5A. FIGS. 7A, 7B, and 7C are cross-sectional views taken along lines I-I', II-II', and III-III' of FIG. 6, respectively. FIGS. 9A and 9B are cross-sectional views taken along lines I-I' and II-II' of FIG. 8, respectively. FIG. 10 is an enlarged plan view of a region 'M' of FIG. 8. First, the first region R1 of FIG. 5A will be described in more detail with reference to FIGS. 6 and 7A to 7C.

Referring to FIGS. 6 and 7A to 7C, an image sensor according to some embodiments of present inventive concepts may include a photoelectric conversion layer 10, an interconnection layer 20, and a light transmission layer 30. The photoelectric conversion layer 10 may be disposed between the interconnection layer 20 and the light transmission layer 30 in a cross-sectional view. For example, the semiconductor substrate 100 may have a first surface (or a front surface) 100a and a second surface (or a back surface) 100b which are opposite to each other. In some embodiments, the interconnection layer 20 may be disposed on the first surface 100a of the semiconductor substrate 100, and the light transmission layer 30 may be disposed on the second surface 100b of the semiconductor substrate 100.

The photoelectric conversion layer 10 may include the semiconductor substrate 100 and first and second photoelectric conversion regions 110a and 110b provided in the semiconductor substrate 100. Light incident from the outside (i.e., from outside of the active pixel sensor array 1) may be converted into electrical signals in the first and second photoelectric conversion regions 110a and 110b.

The interconnection layer 20 may include logic transistors (see TX1, TX2, RX, DX, and SX of FIG. 3) electrically connected to the first and second photoelectric conversion regions 110a and 110b, and interconnection lines 212, 213, and 214 electrically connected to the logic transistors. The electrical signals converted in the first and second photoelectric conversion regions 110a and 110b may be signal-processed in the interconnection layer 20. The interconnection lines 212, 213, and 214 may be disposed in interlayer insulating layers 222, 223, and 224 stacked on the first surface 100a of the semiconductor substrate 100. According to some embodiments of present inventive concepts, the interconnection lines 212, 213, and 214 may be arranged regardless of arrangement of the first and second photoelectric conversion regions 110a and 110b. In other words, the interconnection lines 212, 213, and 214 may cross over the first and second photoelectric conversion regions 110a and 110b.

The light transmission layer 30 may include color filters 303G, 303R, and 303B and micro lenses 307G, 307R, and 307B. The light transmission layer 30 may concentrate and filter incident light and may provide the concentrated and filtered light to the photoelectric conversion layer 10.

In more detail, the semiconductor substrate 100 may, be a substrate in which an epitaxial layer having a first conductivity type (e.g., a P-type) may be formed on a bulk silicon substrate having the first conductivity type. In some embodiments, due to a process of manufacturing an image sensor, the bulk silicon substrate may be removed to leave only the P-type epitaxial layer in the semiconductor substrate 100. In some embodiments, the semiconductor substrate 100 may be a bulk semiconductor substrate including a well having the first conductivity type. Alternatively, in some embodiments, the semiconductor substrate 100 may include one of other various substrates such as an N-type epitaxial layer, a bulk silicon substrate, and a silicon-on-insulator (SOI) substrate.

According to some embodiments of present inventive concepts, the semiconductor substrate 100 may include a plurality of unit pixel regions PG1, PG2, PR, and PB defined by a first isolation structure 101. The first isolation structure 101 may be a device isolation layer defining the unit pixel regions PG1, PG2, PR, and PB.

The plurality of unit pixel regions PG1, PG2, PR, and PB may be arranged in a matrix form along a first direction D1 and a second direction D2 intersecting the first direction D1. In some embodiments, the plurality of unit pixel regions may include first to third pixel regions PG1, PG2, PR, and PB. Lights having wavelength bands that are different from each other may be incident on the first to third pixel regions PG1, PG2, PR, and PB. For example, light of a first wavelength band may be incident on the first pixel regions PG1 and PG2, and light of a second wavelength band longer than the first wavelength band may be incident on the second pixel regions PR. Light of a third wavelength band shorter than the first wavelength band may be incident on the third pixel regions PB. For example, green light may be incident on the first pixel regions PG1 and PG2, red light may be incident on the second pixel regions PR, and blue light may be incident on the third pixel regions PB.

The first pixel regions PG1 and PG2 may be arranged along the first direction D1 and the second direction D2 and may be spaced apart from each other. Each of the second pixel regions PR may be disposed between the first pixel regions PG1 adjacent to each other in the second direction D2 and between the first pixel regions PG2 adjacent to each other in the first direction D1. Each of the third pixel regions PB may be disposed between the first pixel regions PG2 adjacent to each other in the second direction D2 and between the first pixel regions PG1 adjacent to each other in the first direction D1. In addition, the third pixel region PB and the second pixel region PR may be arranged in a diagonal direction (e.g., a third direction D3).

The isolation structure 101 may impede/prevent photocharges, which are generated by light incident on each of the first to third pixel regions PG1, PG2, PR, and PB, from being diffused into neighboring pixel regions PG1, PG2, PR, and PB by random drift. In other words, the first isolation structure 101 may reduce/prevent a crosstalk phenomenon between the first to third pixel regions PG1, PG2, PR, and PB.

The first isolation structure 101 may surround each of the first to third pixel regions PG1, PG2, PR, and PB when viewed from a plan view. In more detail, the first isolation structure 101 may include first portions P1 and second portions P2. The first portions P1 may extend in the second direction D2 and may be spaced apart from each other in the first direction D1. The second portions P2 may extend in the first direction D1 and may be spaced apart from each other in the second direction D2. Each of the first to third pixel regions PG1, PG2, PR, and PB may be defined by a pair of the first portions P1 and a pair of the second portions P2.

The first isolation structure 101 may be formed of an insulating material of which a refractive index is lower than that of the semiconductor substrate 100 (e.g., silicon). The first isolation structure 101 may include one insulating layer or a plurality of insulating layers. For example, the first isolation structure 101 may be formed of a silicon oxide layer, a silicon nitride layer, an undoped poly-silicon layer, air, or any combination thereof. In some embodiments, the first surface 100a and/or the second surface 100b of the semiconductor substrate 100 may be patterned to form a deep trench, and then, the isolation structure 101 may be formed by filling the deep trench with an insulating material.

The first isolation structure 101 may extend from the second surface 100b of the semiconductor substrate 100 toward the first surface 100a of the semiconductor substrate 100 when viewed from a cross-sectional view. However, the first isolation structure 101 may be vertically spaced apart from the first surface 100a of the semiconductor substrate 100. In other words, the first isolation structure 101 may have a first depth d1 that may be smaller than a vertical thickness of the semiconductor substrate 100. In some embodiments, unlike FIGS. 7A to 7C, the first isolation structure 101 may penetrate the semiconductor substrate 100. In other words, the first depth d1 of the first isolation structure 101 may be substantially equal to the vertical thickness of the semiconductor substrate 100. In some embodiments, the first isolation structure 101 may vertically extend from the first surface 100a of the semiconductor substrate 100 toward the second surface 100b of the semiconductor substrate 100. Accordingly, the first isolation structure 101 may optionally be vertically spaced apart from the second surface 100b of the semiconductor substrate 100.

A top surface of the first isolation structure 101 may have a first width W1. Meanwhile, a width of the first isolation structure 101 may become progressively less (i.e., may be tapered) from the second surface 100b toward the first surface 100a of the semiconductor substrate 100. Alternatively, unlike FIGS. 7A to 7C, the width of the first isolation structure 101 may become progressively less (i.e., may be tapered) from the first surface 100a toward the second surface 100b of the semiconductor substrate 100.

The first and second photoelectric conversion regions 110a and 110b may be disposed in the semiconductor substrate 100 of each of the first to third pixel regions PG1, PG2, PR, and PB. In other words, a pair of photoelectric conversion regions 110a and 110b may be disposed in each of the pixel regions PG1, PG2, PR, and PB. Each of the first and second photoelectric conversion regions 110a and 110b may be a dopant region doped with dopants having a second conductivity type (e.g., an N-type) opposite to the first conductivity type of the semiconductor substrate 100. In some embodiments, the first and second photoelectric conversion regions 110a and 110b may be adjacent to the first surface 100a of the semiconductor substrate 100 and may be vertically spaced apart from the second surface 100b of the semiconductor substrate 100. In more detail, dopants of the second conductivity type may be ion-implanted to the first surface 100a of the semiconductor substrate 100 to form the first and second photoelectric conversion regions 110a and 110b. A dopant concentration of a region, adjacent to the first surface 100a, of each of the first and second photoelectric conversion regions 110a and 110b may be different from a dopant concentration of another region, adjacent to the second surface 100b, of each of the first and second photoelectric conversion regions 110a and 110b. Thus, each of the first and second photoelectric conversion regions 110a and 110b may have a potential gradient between the first surface 100a and the second surface 100b of the semiconductor substrate 100.

The semiconductor substrate 100 and the first and second photoelectric conversion regions 110a and 110b may constitute a pair of photodiodes. In other words, the photodiode may be formed by P-N junction of the semiconductor substrate 100 having the first conductivity type and the first or second photoelectric conversion region 110a or 110b having the second conductivity type. Each of the first and second photoelectric conversion regions 110a and 110b forming the photodiodes may generate or accumulate photocharges in proportion to the intensity of incident light. In addition, each of the photodiodes may further include a P-type dopant region that is shallowly doped with P-type dopants at a surface of each of the first and second photoelectric conversion regions 110a and 110b.

In each of the pixel regions PG1, PG2, PR, and PB, a phase difference may occur between an electrical signal outputted from the first photoelectric conversion region 110a and an electrical signal outputted from the second photoelectric conversion region 110b. The image sensor according to some embodiments of present inventive concepts may compare phases of the electrical signals outputted from the pair of first and second photoelectric conversion regions 110a and 110b to correct a focus of an imaging apparatus.

In each of the first and third pixel regions PG1, PG2, and PB, a second isolation structure 103 may be disposed between the first and second photoelectric conversion regions 110a and 110b. The second isolation structure 103 may include a first portion 103a extending in the second direction D2 and a second portion 103b extending in the first direction D1 when viewed from a plan view. The first portion 103a of the second isolation structure 103 may intersect the first and second photoelectric conversion regions 110a and 110b in a plan view, and the second portion 103b of the second isolation structure 103 may be disposed between the first and second photoelectric conversion regions 110a and 110b.

The second isolation structure 103 may extend from the second surface 100b of the semiconductor substrate 100 toward the first surface 100a of the semiconductor substrate 100 when viewed from a cross-sectional view. In other words, the second isolation structure 103 may have a second depth d2 that may be smaller than the vertical thickness of the semiconductor substrate 100. Moreover, according to some embodiments of present inventive concepts, the second depth d2 may be substantially equal to the first depth d1 of the first isolation structure 101 described above.

In addition, a top surface of the second isolation structure 103 may have a second width W2. Meanwhile, a width of the second isolation structure 103 may become progressively less (i.e., may be tapered) from the second surface 100b toward the first surface 100a of the semiconductor substrate 100. According to some embodiments of present inventive concepts, the second width W2 may be substantially equal to the first width W1 of the first isolation structure 101 described above.

In each of the first and third pixel regions PG1, PG2, and PB, the first and second photoelectric conversion regions 110a and 110b may be isolated or separated from each other by the second portion 103b of the second isolation structure 103. In other words, the first photoelectric conversion region 110a may be surrounded by the second portion 103b of the second isolation structure 103 and a portion of the first isolation structure 101 in each of the first and third pixel regions PG1, PG2, and PB, and the second photoelectric conversion region 110b may be surrounded by the second portion 103b of the second isolation structure 103 and another portion of the first isolation structure 101 in each of the first and third pixel regions PG1, PG2, and PB. In some embodiments, the first and second photoelectric conversion regions 110a and 110b of each of the first and third pixel regions PG1, PG2, and PB may be in contact with a sidewall of the first isolation structure 101 and a sidewall of the second portion 103b of the second isolation structure 103.

In addition, in each of the first and third pixel regions PG1, PG2, and PB, a portion of the first photoelectric conversion region 110a may be disposed between the first portion 103a of the second isolation structure 103 and the first surface 100a of the semiconductor substrate 100. Likewise, a portion of the second photoelectric conversion region 110b may be disposed between the first portion 103a of the second isolation structure 103 and the first surface 100a of the semiconductor substrate 100.

In some embodiments, the second surface 100b of the semiconductor substrate 100 may be patterned to form a deep trench in the semiconductor substrate 100, and the second isolation structure 103 may be formed by filling the deep trench with an insulating material. As described above, the width of the second isolation structure 103 may become progressively less from the second surface 100b toward the first surface 100a of the semiconductor substrate 100. In addition, the second isolation structure 103 may be vertically spaced apart from the first surface 100a of the semiconductor substrate 100. In some embodiments, the second isolation structure 103 may be formed by patterning the first surface 100a of the semiconductor substrate 100. Accordingly, the second isolation structure 103 may optionally be vertically spaced apart from the second surface 100b of the semiconductor substrate 100.

In some embodiments, the second isolation structure 103 may be formed simultaneously with the first isolation structure 101, and thus the second isolation structure 103 may include the same insulating material as the first isolation structure 101. In addition, the second isolation structure 103 and the first isolation structure 101 may constitute one body in the semiconductor substrate 100. The second isolation structure 103 may be formed of an insulating material of which a refractive index is lower than that of the semiconductor substrate 100. For example, the second isolation structure 103 may be formed of a silicon oxide layer, a silicon nitride layer, an undoped poly-silicon layer, air, or any combination thereof. The second isolation structure 103 may reduce/prevent crosstalk between the first and second photoelectric conversion regions 110a and 110b in each of the first and third pixel regions PG1, PG2, and PB. Thus, a phase difference between electrical signals can be accurately detected in each of the first and third pixel regions PG1, PG2, and PB. In other words, an auto-focusing characteristic may be improved in each of the first and third pixel regions PG1, PG2, and PB.

Light incident on each of the first and third pixel regions PG1, PG2, and PB may be irregularly reflected by the second isolation structure 103, and thus the irregularly reflected light may be incident on a pixel region adjacent thereto in the first direction D1 and a pixel region adjacent thereto in the second direction D2. However, since the second isolation structure 103 includes the first portion 103a and the second portion 103b intersecting each other, the amount of the light incident on the pixel region of the first direction D1 may be substantially equal to the amount of the light incident on the pixel region of the second direction D2. Thus, it is possible to reduce a noise difference which may occur according to positions of the first pixel regions PG1 and PG2.

In each of the second pixel regions PR, an isolation dopant region 105 may be disposed between the first and second photoelectric conversion regions 110a and 110b. The wavelength band of light incident on the second pixel region PR including the isolation dopant region 105 may be longer than the wavelength bands of lights incident on the first and third pixel regions PG1, PG2, and PB. Thus, the isolation dopant region 105 may have a different shape from the second isolation structure 103. If the second isolation structure 103 described above is instead applied to the second pixel regions PR, long-wavelength light incident on the second pixel regions PR may be easily irregularly reflected by the second isolation structure 103. This irregularly reflected light may cause a crosstalk phenomenon between the second pixel regions PR and the first pixel regions PG1 and PG2 adjacent to the second pixel regions PR.

In more detail, the isolation dopant region 105 may have a linear shape extending in the first direction D1 when viewed from a plan view. The isolation dopant region 105 may be in contact with the first isolation structure 101. In addition, the isolation dopant region 105 may vertically extend from the second surface 100b of the semiconductor substrate 100 toward the first surface 100a of the semiconductor substrate 100 when viewed from a cross-sectional view. The first photoelectric conversion region 110a may be surrounded by the isolation dopant region 105 and a portion of the first isolation structure 101 in each of the second pixel regions PR, and the second photoelectric conversion region 110b may be surrounded by the isolation dopant region 105 and another portion of the first isolation structure 101 in each of the second pixel regions PR.

In some embodiments, the isolation dopant region 105 may be a dopant region that is formed in the semiconductor substrate 100 and has the first conductivity type. In detail, the isolation dopant region 105 may be formed by ion-implanting dopants of the first conductivity type into the semiconductor substrate 100 of the second pixel regions PR. For example, the isolation dopant region 105 may be formed by ion-implanting the dopants of the first conductivity type to the second surface 100b of the semiconductor substrate 100. The isolation dopant region 105 may be vertically spaced apart from the first surface 100a of the semiconductor substrate 100. In other words, the isolation dopant region 105 may have a third depth d3 that may be smaller than the vertical thickness of the semiconductor substrate 100. Meanwhile, the third depth d3 may be substantially equal to or different from the first depth d1 of the first isolation structure 101 and the second depth d2 of the second isolation structure 103.

Since the isolation dopant region 105 is the dopant region of the first conductivity type, a potential barrier between the first and second photoelectric conversion regions 110a and 110b may impede/prevent photocharges generated in the first photoelectric conversion region 110a from flowing into the second photoelectric conversion region 110b and/or may impede/prevent photocharges generated in the second photoelectric conversion region 110b from flowing into the first photoelectric conversion region 110a. In addition, since the isolation dopant region 105 is formed of the same semiconductor material as the first and second photoelectric conversion regions 110a and 110b, light incident on the second pixel regions PR may not be refracted and reflected by the isolation dopant region 105 extending in the first direction D1. In other words, irregularly reflected light incident on the pixel region adjacent to the second pixel region PR in the second direction D2 may be reduced to decrease a crosstalk phenomenon therebetween. As a result, it is possible to reduce a noise difference which may occur according to positions of the first pixel regions PG1 and PG2 adjacent to the second pixel region PR.

In each of the first to third pixel regions PG1, PG2, PR, and PB, a floating diffusion layer 120 may be disposed between the first and second photoelectric conversion regions 110a and 110b. The floating diffusion layer 120 may be formed by ion-implanting dopants of the second conductivity type to the first surface 100a of the semiconductor substrate 100.

A first transfer gate electrode 201a may be disposed on the first surface 100a of the semiconductor substrate 100 between the first photoelectric conversion region 110a and the floating diffusion layer 120, and a second transfer gate electrode 201b may be disposed on the first surface 100a of the semiconductor substrate 100 between the second photoelectric conversion region 110b and the floating diffusion layer 120. A first interlayer insulating layer 221 may cover the first and second transfer gate electrodes 201a and 201b. Second to fourth interlayer insulating layers 222, 223, and 224 may be disposed on the first interlayer insulating layer 221.

The first to third color filters 303G, 303R, and 303B and the first to third micro lenses 307G, 307R, and 307B may be disposed on the second surface 100b of the semiconductor substrate 100. The first to third color filters 303G, 303R, and 303B may be disposed on the first to third pixel regions PG1, PG2, PR, and PB, respectively, and the first to third micro lenses 307G, 307R, and 307B may be disposed on the first to third color filters 303G, 303R, and 303B, respectively. In addition, a first planarization layer 301 may be disposed between the second surface 100b of the semiconductor substrate 100 and the color filters 303G, 303R, and 303B, and a second planarization layer 305 may be disposed between the color filters 303G, 303R, and 303B and the micro lenses 307G, 307R, and 307B.

The first to third color filters 303G, 303R, and 303B may include the green, red, and blue color filters described with reference to FIG. 4A, respectively. Alternatively, the first to third color filters 303G, 303R, and 303B may have other colors such as cyan, magenta, and yellow. In some embodiments, the first color filters 303G having green colors may be disposed on the first pixel regions PG1 and PG2, the second color filters 303R having red colors may be disposed on the second pixel regions PR, and the third color filters 303B having blue colors may be disposed on the third pixel regions PB.

The first to third micro lenses 307G, 307R, and 307B may have convex shapes to concentrate lights incident on the first to third pixel regions PG1, PG2, PR, and PB. Each of the first to third micro lenses 307G, 307R, and 307B may overlap the pair of first and second photoelectric conversion regions 110a and 110b when viewed from a plan view. In other words, a center of each of the first to third micro lenses 307G, 307R, and 307B may be substantially aligned with a center of each of the pixel regions PG1, PG2, PR, and PB.

Next, the second region R2 of FIG. 5A will be described in detail with reference to FIGS. 8, 9A, 9B, and 10. In the second region R2, the descriptions to the same features as in the first region R1 may be omitted or mentioned briefly for the purpose of ease and convenience in explanation. In other words, mainly differences between the second region R2 and the first region R1 will be described.

Referring to FIGS. 8, 9A, 9B, and 10, the second isolation structure 103 may be shifted in the third direction D3 in each of the first and third pixel regions PG1, PG2, and PB. In other words, the second isolation structure 103 of the second region R2 may be shifted in the third direction D3 as compared with the second isolation structure (see V103 of FIG. 9B) of the first region R1 described above.

The words "shift" and "shifted," as used herein, may refer to an offset between two elements. For example, the two elements may not be aligned in a vertical direction (i.e., may not be centered on the same vertical axis), as a vertical axis extending through the center of one of the elements may not be aligned with a vertical axis extending through the center of the other one of the elements. Accordingly, the term "center," as used herein, may refer to a central/centered vertical axis.

The third direction D3 may be the direction in which the center of the semiconductor substrate 100 is spaced apart from the second region R2. In some embodiments, a center C103 of the second isolation structure 103 may be shifted from a center CPG2 of the first pixel region PG2 by a first distance L1 in the third direction D3 when viewed from a plan view. In some embodiments, a center C103 of the second isolation structure 103 of the third pixel region PB may be shifted from a center CPB of the third pixel region PB by a second distance L2 in the third direction D3 when viewed from a plan view. In some embodiments, the first distance L1 may be substantially equal to the second distance L2. On the contrary, in each of the second pixel regions PR, the isolation dopant region 105 may be disposed at a center of the second pixel region PR.

Each of the first to third micro lenses 307G, 307R, and 307B may be shifted in the third direction D3. In some embodiments, a center C307G of the first micro lens 307G may be shifted from the center CPG2 of the first pixel region PG2 by a third distance L3 in the third direction D3 when viewed from a plan view. Thus, a portion of the first micro lens 307G may vertically overlap a portion of the third pixel region PB adjacent to the first pixel region PG2. In some embodiments, a center C307B of the third micro lens 307B may be shifted from the center CPB of the third pixel region PB by a fourth distance L4 in the third direction D3 when viewed from a plan view. In some embodiments, the third distance L3 may be substantially equal to the fourth distance L4. In addition, in some embodiments, a center of the second micro lens 307R may be shifted from the center of the second pixel region PR by a fifth distance in the third direction D3, and the fifth distance may be substantially equal to the third distance L3 and the fourth distance L4.

Referring again to FIGS. 5B and 9B, the second light LI2 incident on the second region R2 may have the second incident angle θ2 smaller than 90 degrees. Thus, the second light LI2 transmitted through each of the first to third micro lenses 307G, 307R, and 307B of the second region R2 may not be irradiated to the center of the pixel region PG1, PG2, PR, or PB of the second region R2. However, since each of the first to third micro lenses 307G, 307R, and 307B of the second region R2 is shifted in the third direction D3 in the image sensor according to some embodiments of present inventive concepts, the second light LI2 may be irradiated close to the center of each of the pixel regions PG1, PG2, PR, and PB. In addition, since the second isolation structure 103 of each of the first and third pixel regions PG1, PG2, and PB is also shifted in the third direction D3, the second light LI2 may be irradiated to the center of the second isolation structure 103. Thus, the second light LI2 may be uniformly scattered on all sides by the second isolation structure 103. As a result, it is possible to reduce a noise difference which may occur according to positions of the first pixel regions PG1 and PG2.

Figure 11:
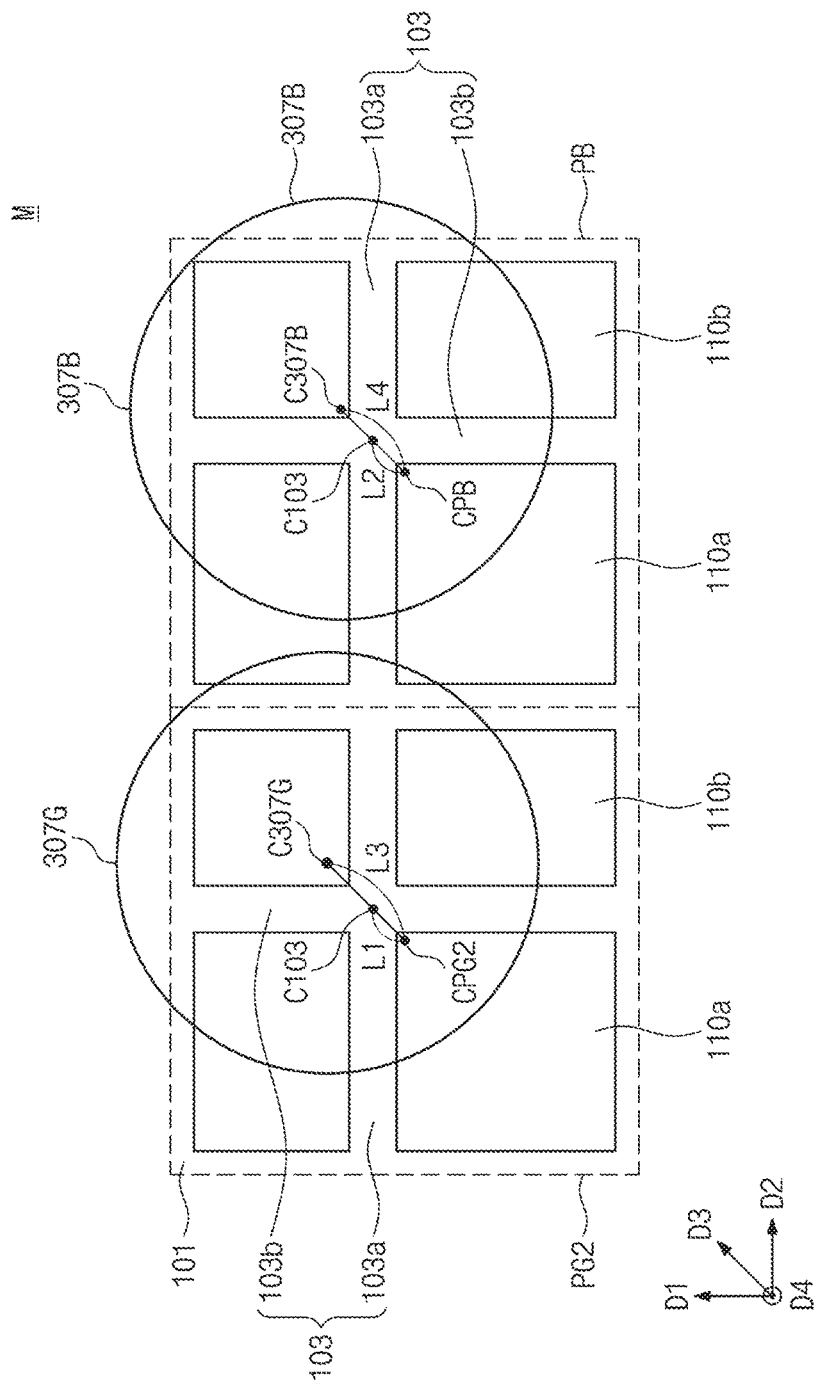
FIGS. 11 and 12 are plan views illustrating image sensors according to some embodiments of present inventive concepts.
Figure 12:
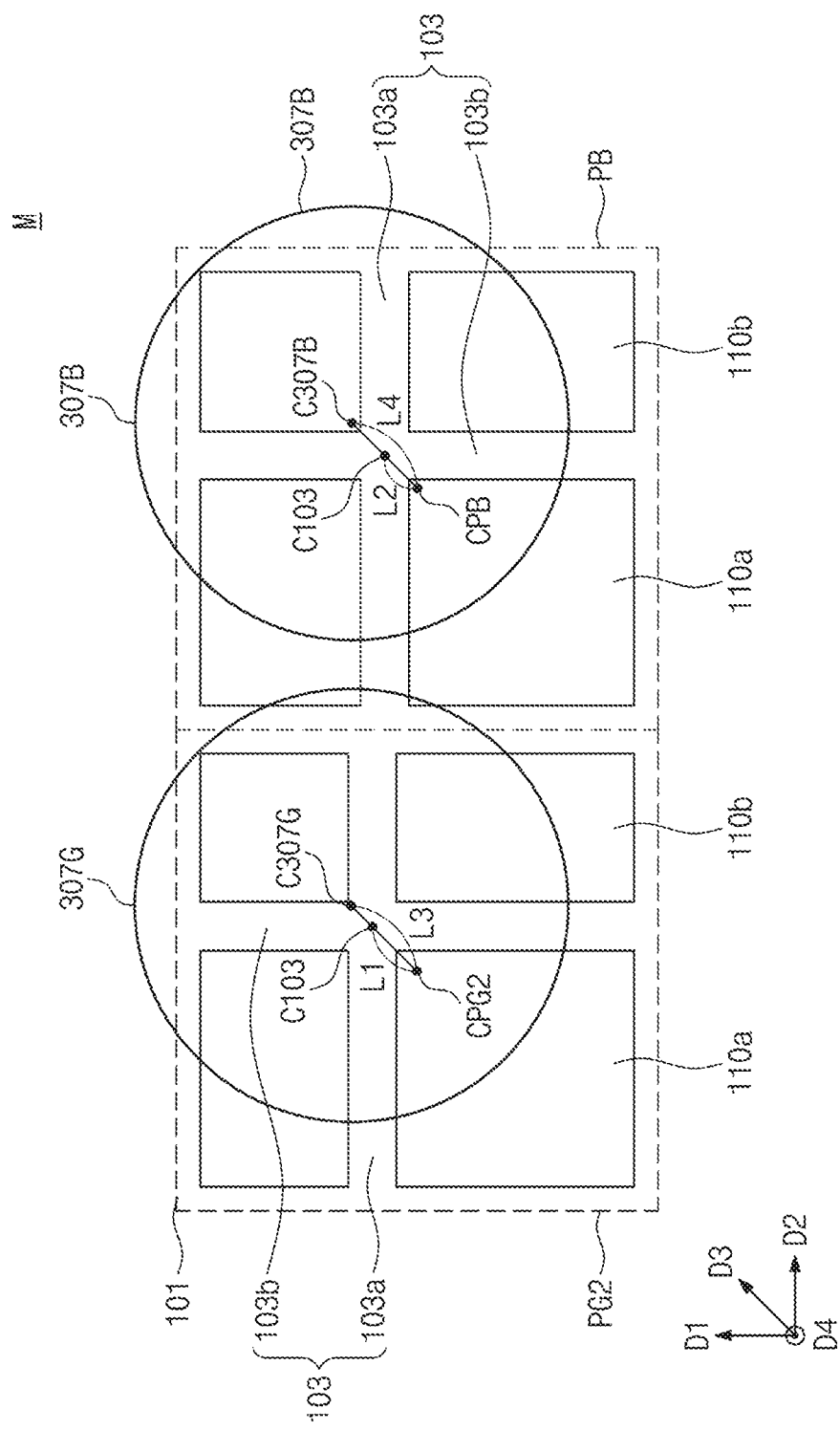

FIGS. 11 and 12 are enlarged plan views of the region 'M' of FIG. 8 to illustrate image sensors according to some embodiments of present inventive concepts. Referring to FIGS. 11 and 12, the descriptions to the same technical features as in FIGS. 8, 9A, 9B, and 10 may be omitted or mentioned briefly for the purpose of ease and convenience in explanation. In other words, mainly differences between FIGS. 11 and 12 and FIGS. 8, 9A, 9B, and 10 will be described hereinafter.

Referring to FIG. 11, the third distance L3 corresponding to the shifted distance of the first micro lens 307G may be different from the fourth distance L4 corresponding to the shifted distance of the third micro lens 307B. For example, the third distance L3 may be greater than the fourth distance L4. In addition, in some embodiments, the fifth distance corresponding to the shifted distance of the second micro lens 307R may be different from the third distance L3 and the fourth distance L4. In other words, the fifth distance, the third distance L3, and the fourth distance L4 may be different from each other.

Light of which wavelength bands are different from each other may be incident on the first to third pixel regions PG1, PG2, PR, and PB. Thus, refracting angles of the light respectively incident on the first to third pixel regions may be different from each other. The shifted distances of first to third micro lenses 307G, 307R, and 307B may be different from each other in consideration of the refracting angles of the first to third pixel regions.

Referring to FIG. 12, the first distance L1 by which the isolation structure 103 of the first pixel region PG2 is shifted may be different from the second distance L2 by which the second isolation structure 103 of the third pixel region PB is shifted. For example, the first distance L1 may be greater than the second distance L2.

Light of which wavelength bands are different from each other may be incident on the first to third pixel regions PG1, PG2, PR, and PB. Thus, refracting angles of the light respectively incident on the first to third pixel regions may be different from each other. The shifted distances of the first and third pixel regions PG1, PG2, and PB may be different from each other in consideration of the refracting angles of the first and third pixel regions PG1, PG2, and PB.

Figure 13:
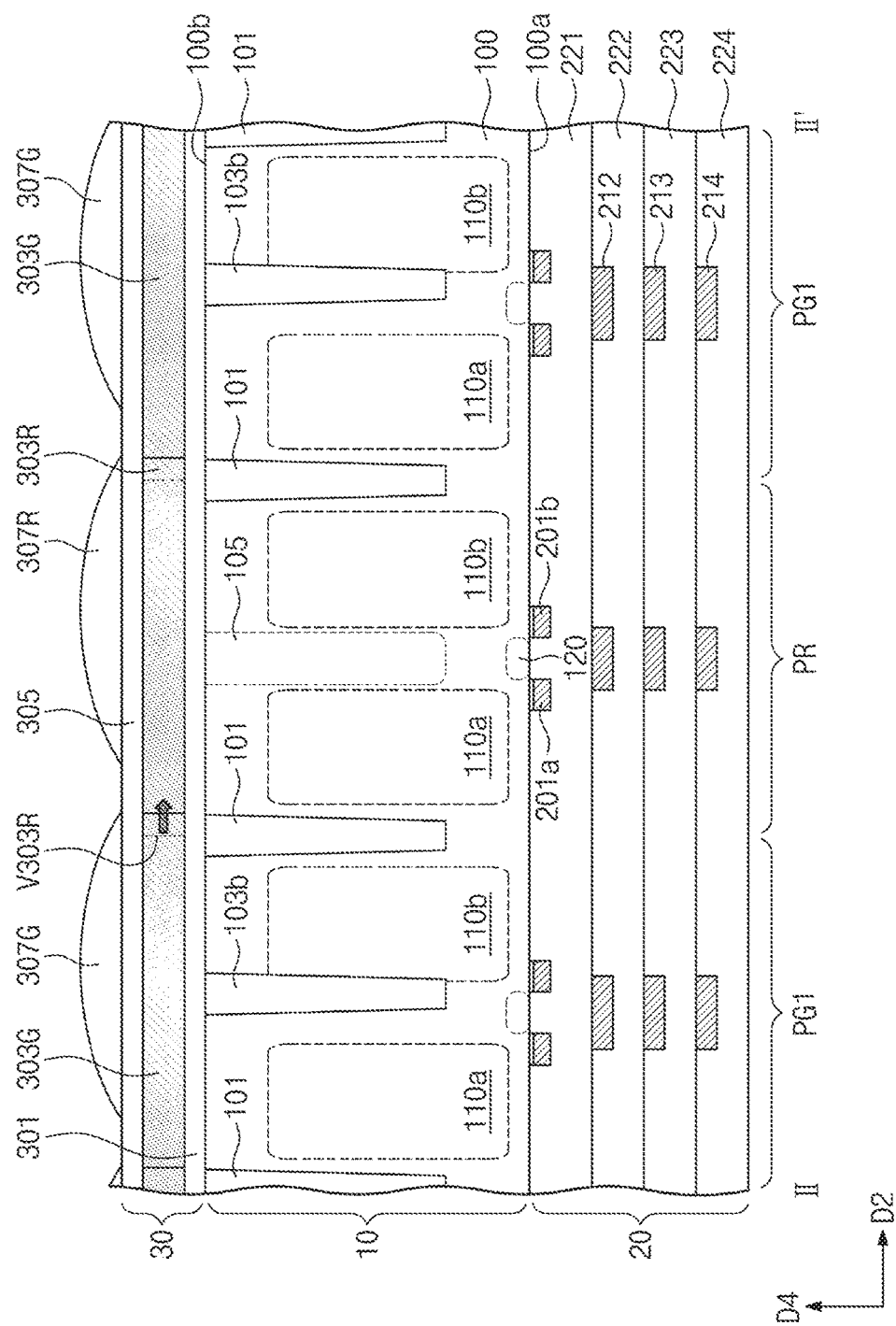
FIGS. 13 to 18 are cross-sectional views illustrating image sensors according to some embodiments of present inventive concepts.
Figure 14:
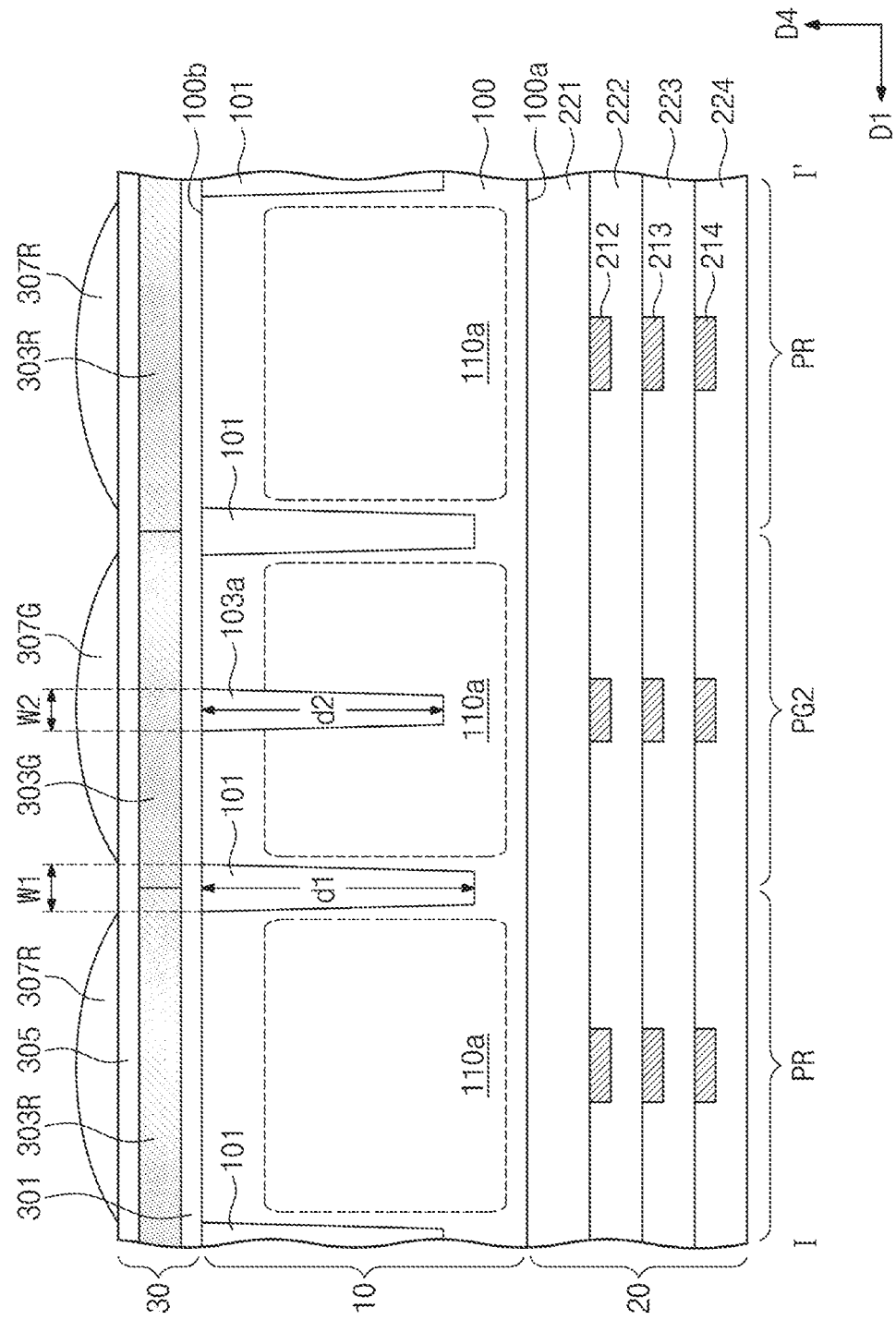

FIGS. 13 to 18 are cross-sectional views illustrating image sensors according to some embodiments of present inventive concepts. FIG. 13 is a cross-sectional view taken along the line II-II' of FIG. 8, FIG. 14 is a cross-sectional view taken along the line I-I' of FIG. 6, and FIGS. 15 to 18 are cross-sectional views taken along the lines II-II' of FIG. 6. With respect to FIGS. 13-18, the descriptions about the same technical features as in FIGS. 6, 7A to 7C, 8, 9A, 9B, and 10 may be omitted or mentioned briefly for the purpose of ease and convenience in explanation. In other words, mainly differences between FIGS. 13-18 and FIGS. 6, 7A to 7C, 8, 9A, 9B, and 10 will be described hereinafter.

According to FIGS. 8 and 13, the first to third color filters 303G, 303R, and 303B may be shifted in the third direction D3. For example, the second color filter 303R of the second region R2 according to some embodiments may be shifted in the third direction D3 as compared with the second color filter (see V303R of FIG. 13) of the first region R1 described above.

As described above with reference to FIGS. 5B and 9B, the second light LI2 incident on the second region R2 may not be irradiated to the center of each of the pixel regions PG1, PG2, PR, and PB. Thus, the first to third color filters 303G, 303R, and 303B may be shifted in the third direction D3 to irradiate the second light LI2 close to the center of each of the first to third color filters 303G, 303R, and 303B.

According to FIGS. 6 and 14, the first width W1 of the top surface of the first isolation structure 101 may be greater than the second width W2 of the top surface of the second isolation structure 103. In addition, the first depth d1 of the first isolation structure 101 may be greater than the second depth d2 of the second isolation structure 103. These features of the first and second isolation structures 101 and 103 may be applied to the second region R2.

Figure 15:
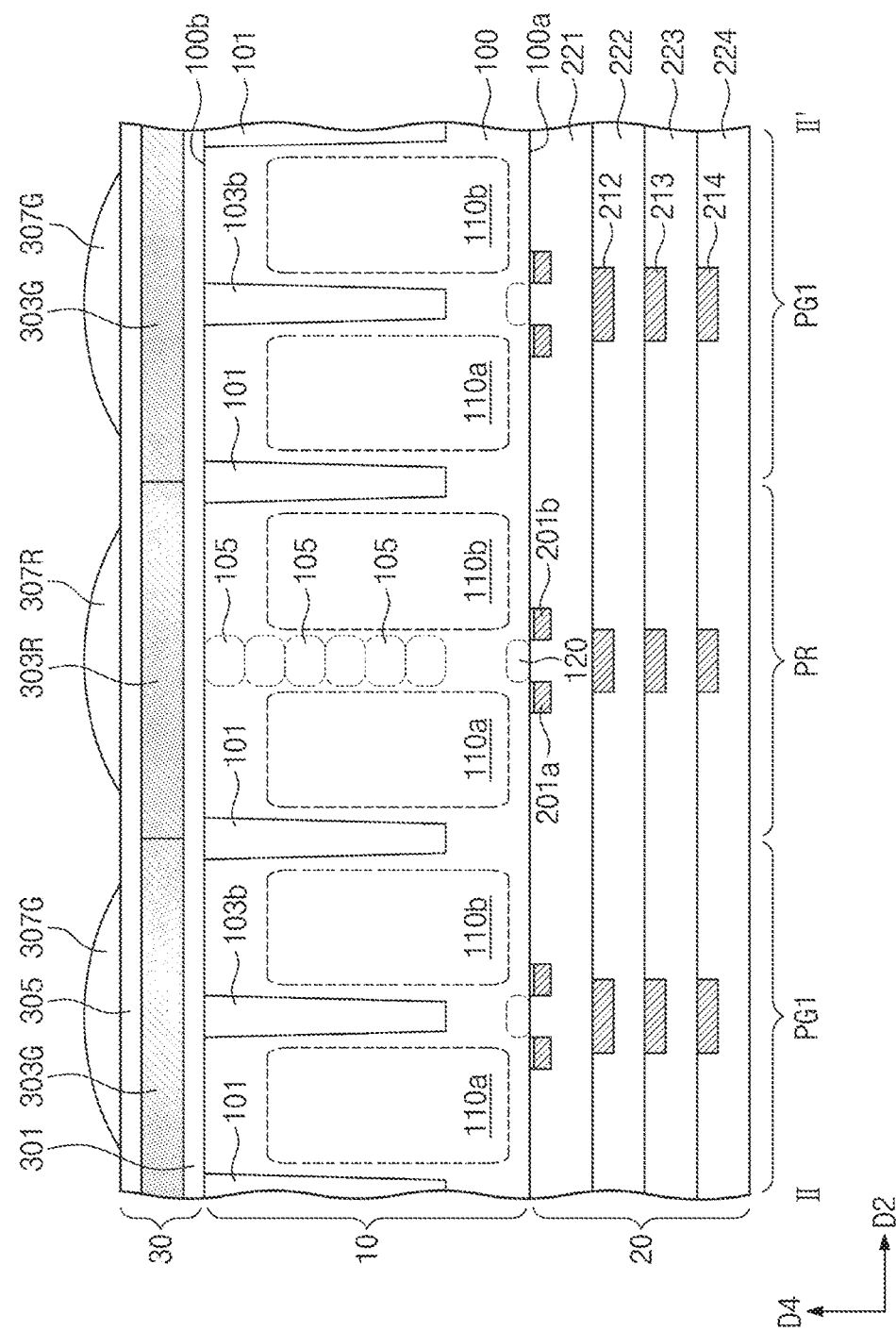

According to FIGS. 6 and 15, in each of the second pixel regions PR, the isolation dopant region 105 may include a plurality of dopant regions doped with dopants of the first conductivity type. This isolation dopant region 105 may be formed by repeatedly performing a plurality of ion implantation processes using the dopants of the first conductivity type. Ion implantation depths of the dopants may be adjusted while repeating the ion implantation processes. In some embodiments, the isolation dopant region 105 may have a dopant concentration that is varied according to a distance from the second surface 100b of the semiconductor substrate 100. These features of the isolation dopant region 105 may be applied to the second region R2.

Figure 16:
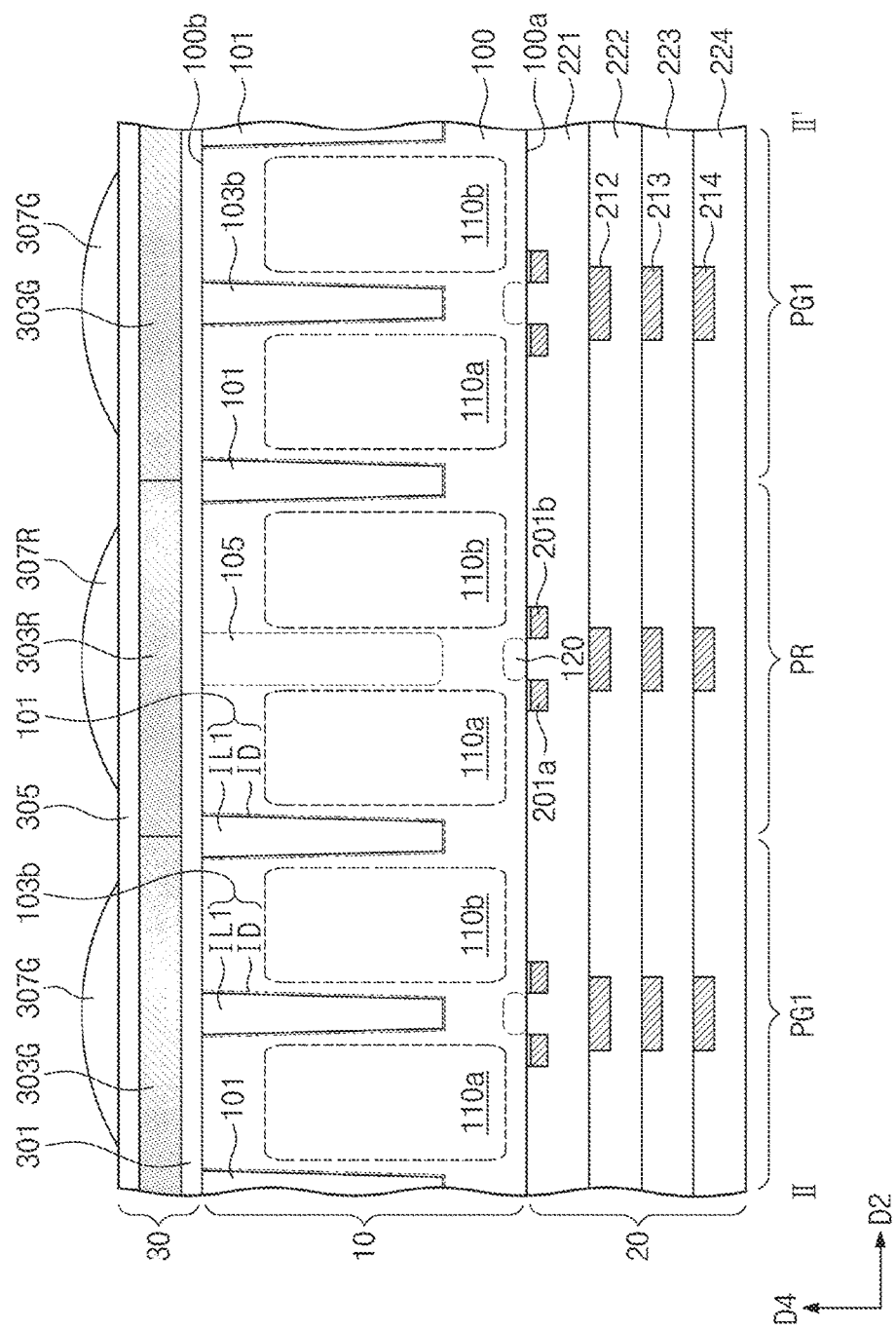

According to FIGS. 6 and 16, the first isolation structure 101 may include an isolation layer IL1 and a dopant layer ID covering a surface of the isolation layer IL1. The dopant layer ID may have the first conductivity type. The dopant layer ID may surround at least a portion of the isolation layer IL1. The dopant layer ID may include dopants of the first conductivity type (e.g., a P-type). The dopant layer ID may be in direct contact with the semiconductor substrate 100 of the first conductivity type. A concentration of the first conductivity type dopants in the dopant layer ID may be higher than a concentration of the first conductivity type dopants in the semiconductor substrate 100. Thus, the dopant layer ID may form a potential barrier around the first and second photoelectric conversion regions 110a and 110b. As a result, the dopant layer ID may reduce a dark current which may occur by electron-hole pairs (EHPs) generated by surface defects of the deep trench when an insulating layer is formed in the deep trench formed by patterning the semiconductor substrate 100.

Like the first isolation structure 101, the second isolation structure 103 may also include the isolation layer IL1 and the dopant layer ID. In addition, the features of the first and second isolation structures 101 and 103 including the isolation layer IL1 and the dopant layer ID may be applied to the second region R2.

Figure 17:
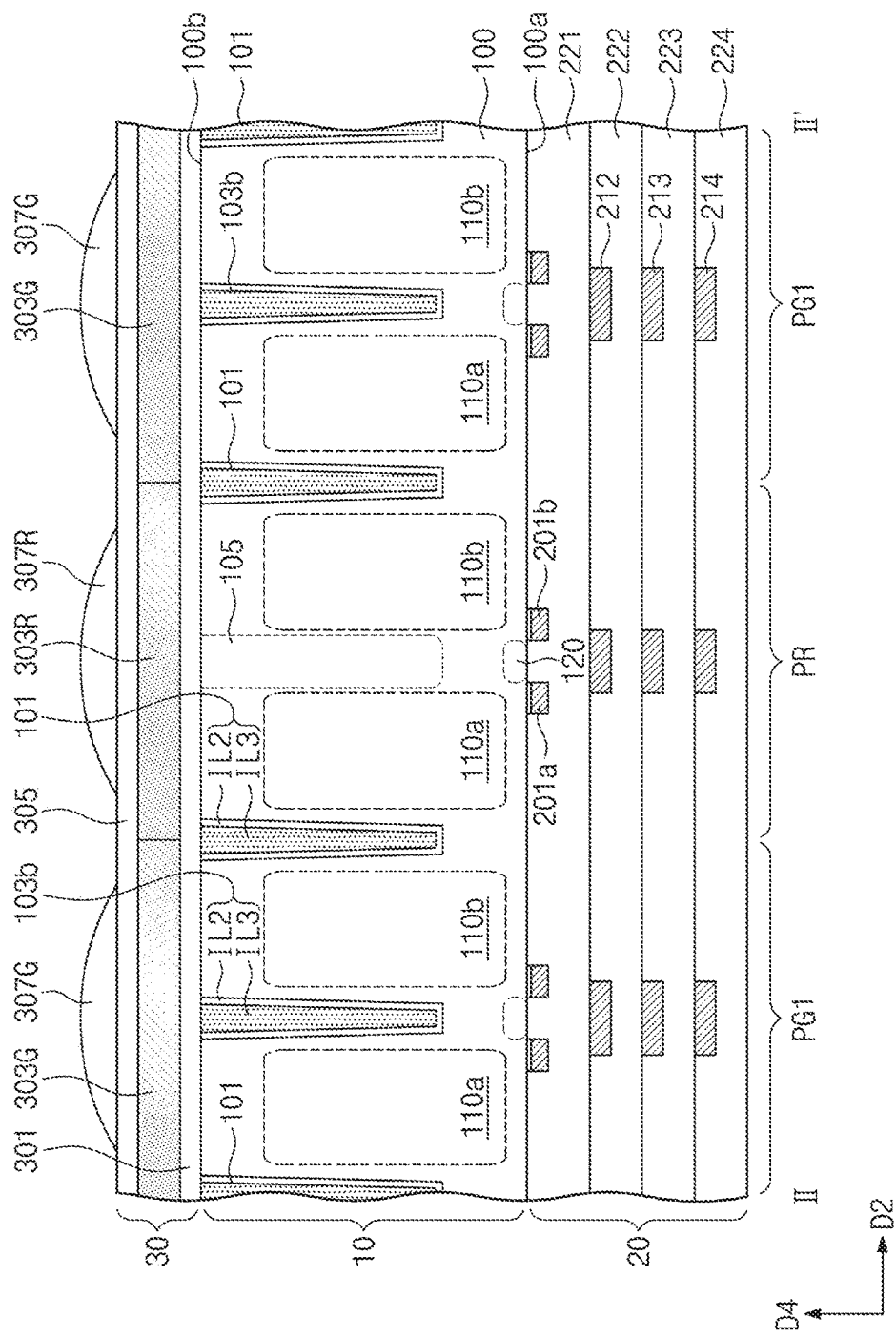

According to FIGS. 6 and 17, the first isolation structure 101 may include first and second isolation layers IL2 and IL3 having refractive indexes different from each other. The first isolation layer IL2 may be in contact with the semiconductor substrate 100, and the second isolation layer IL3 may be disposed in the first isolation layer IL2. Light obliquely incident on the first isolation structure 101 may be refracted at an interface between the first and second isolation layers IL2 and IL3 by a difference between the refractive indexes of the first and second isolation layers IL2 and IL3. For example, the first isolation layer IL2 may include a silicon oxide layer, a silicon nitride layer, or a silicon oxynitride layer, and the second isolation layer IL3 may include a silicon oxide layer, a silicon nitride layer, a silicon oxynitride layer, a poly-silicon layer, or a metal layer.

Like the first isolation structure 101, the second isolation structure 103 may also include the first and second isolation layers IL2 and IL3. In addition, the features of the first and second isolation structures 101 and 103 including the first and second isolation layers IL2 and IL3 may be applied to the second region R2.

Figure 18:
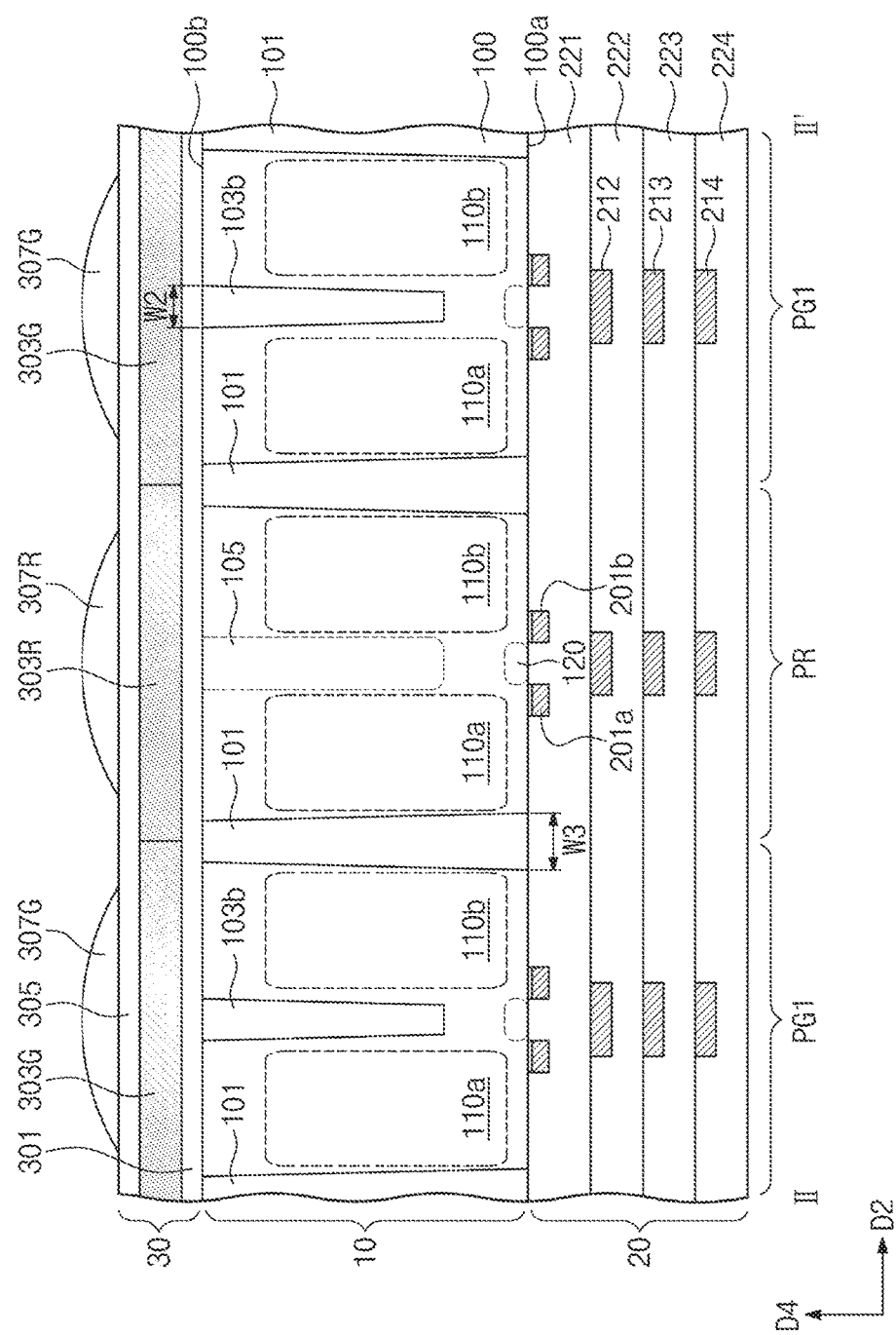

According to FIGS. 6 and 18, the first isolation structure 101 may penetrate the semiconductor substrate 100. The first isolation structure 101 may be formed by patterning the first surface 100a of the semiconductor substrate 100. Thus, the width of the first isolation structure 101 may become progressively less from (i.e., may be tapered from) the first surface 100a toward the second surface 100b of the semiconductor substrate 100. A bottom surface of the first isolation structure 101 may have a third width W3. In some embodiments, the third width W3 may be greater than the second width W2 of the top surface of the second isolation structure 103. In addition, a depth of the first isolation structure 101 may be greater than the depth of the second isolation structure 103. These features of the first isolation structure 101 described with reference to FIGS. 6 and 18 may be applied to the second region R2.

Figure 19:
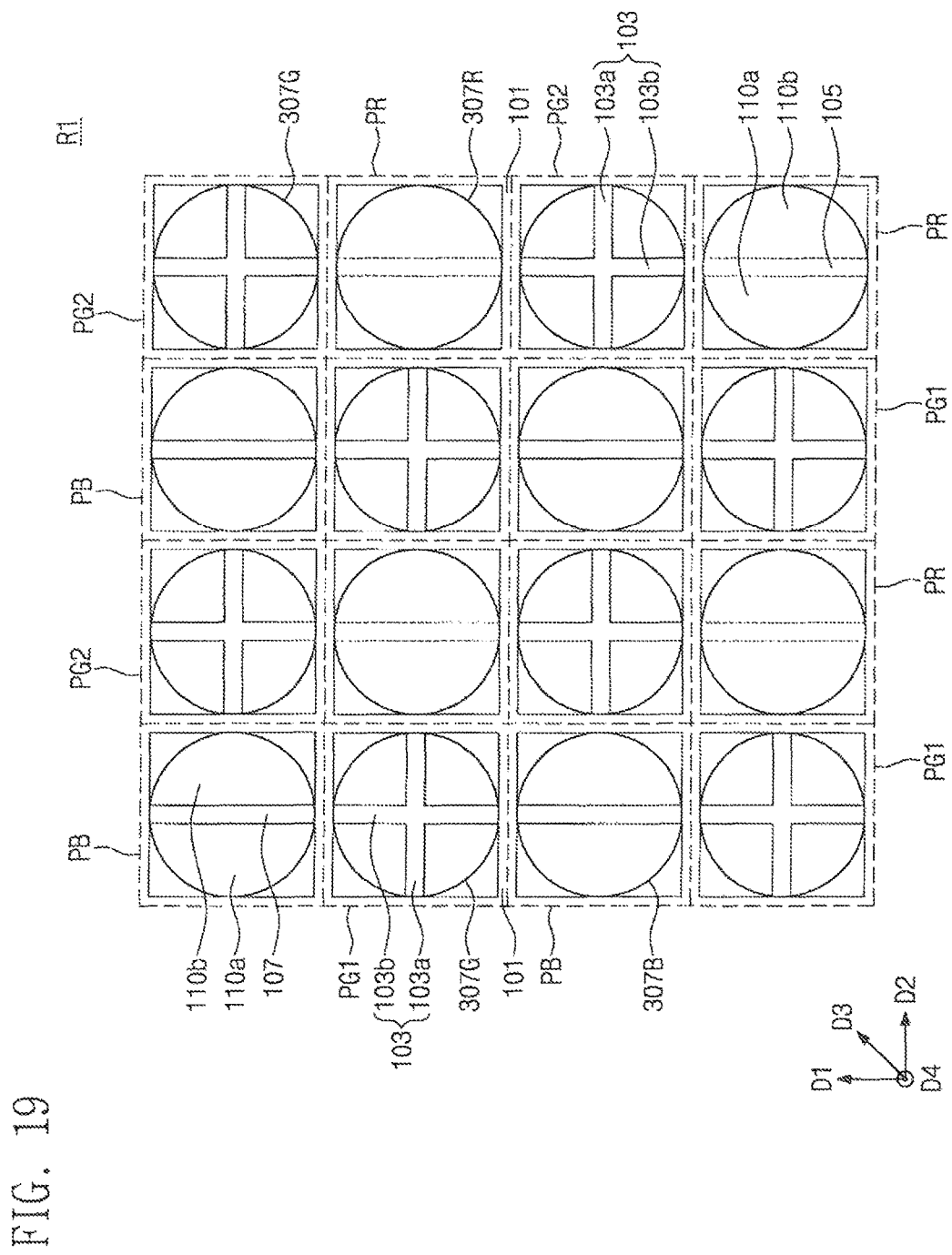
FIGS. 19 and 20 are plan views illustrating an image sensor according to some embodiments of present inventive concepts.
Figure 20:
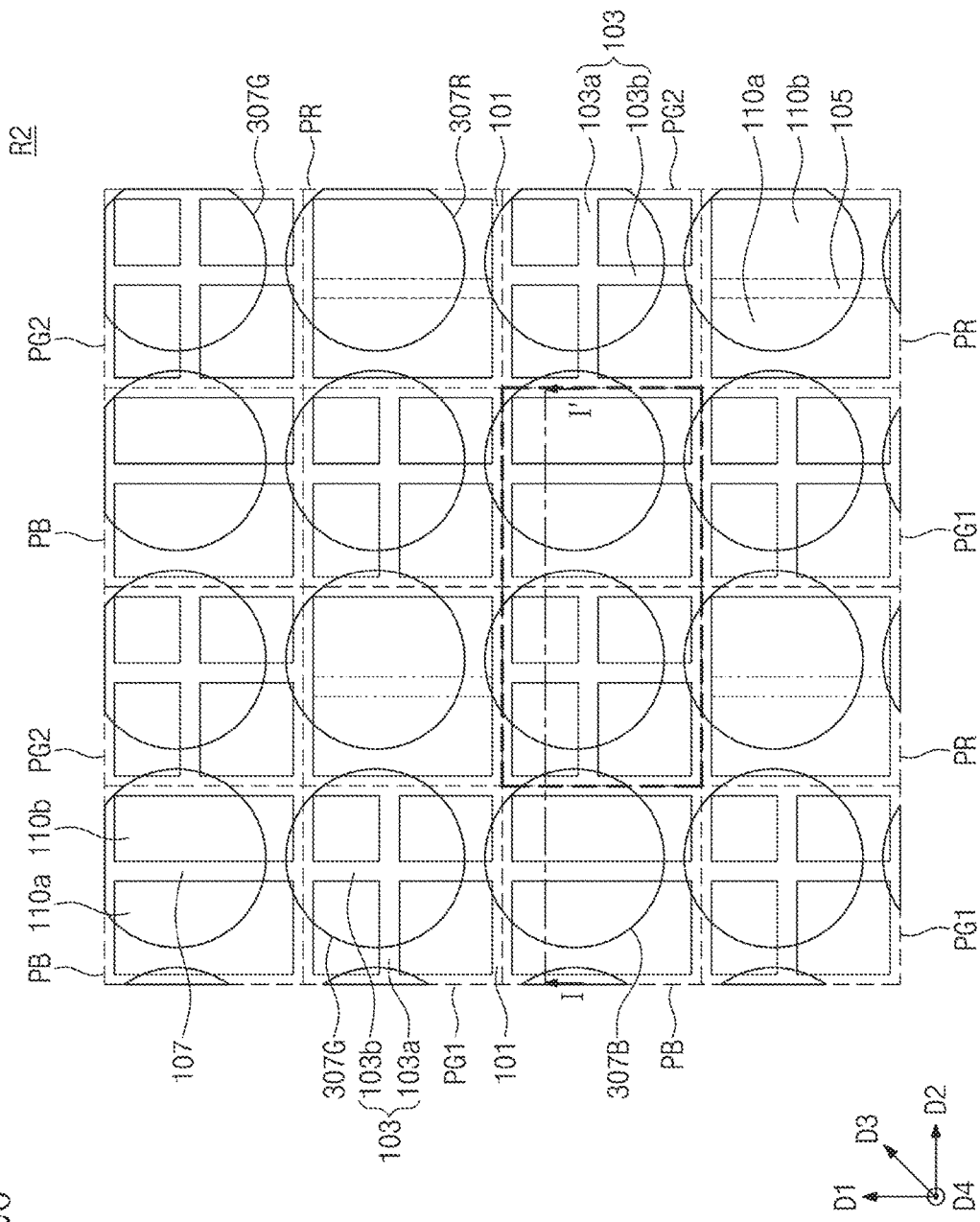
Figure 21:
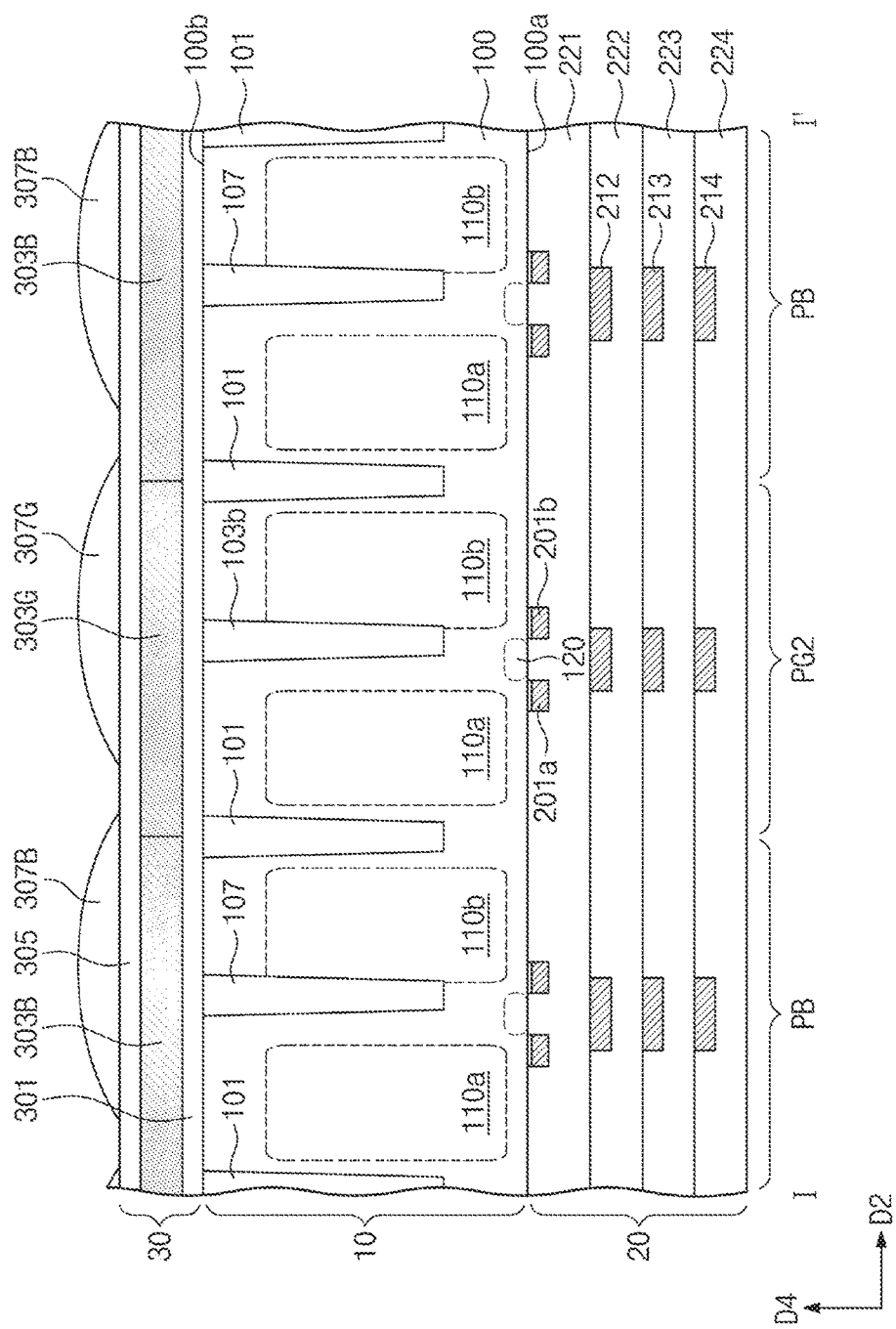
FIG. 21 is a cross-sectional view taken along a line I-I' FIG. 20.

FIGS. 19 and 20 are plan views illustrating an image sensor according to some embodiments of present inventive concepts. FIG. 19 is an enlarged plan view of the first region R1 of FIG. 5A, and FIG. 20 is an enlarged plan view of the second region R2 of FIG. 5A. FIG. 21 is a cross-sectional view taken along a line I-I' FIG. 20. Referring to FIGS. 19-21, the descriptions to the same technical features as in FIGS. 6, 7A to 7C, 8, 9A, 9B, and 10 may be omitted or mentioned briefly for the purpose of ease and convenience in explanation. In other words, mainly differences between FIGS. 19-21 and FIGS. 6, 7A to 7C, 8, 9A, 9B, and 10 will be described hereinafter.

Referring to FIGS. 19 to 21, a third isolation structure 107 may be disposed between the first and second photoelectric conversion regions 110a and 110b in each of the third pixel regions PB. The third isolation structure 107 may have a linear shape extending in the first direction D1 when viewed from a plan view. The third isolation structure 107 may be connected to the first isolation structure 101 to constitute one body in the semiconductor substrate 100. In other words, the third isolation structure 107 may have the same shape as the second isolation structure 103 of FIGS. 6, 7A to 7C, 8, 9A, 9B, and 10, the first portion 103a of which is omitted. In addition, in the second region R2, a center of the third isolation structure 107 may be shifted from the center of the third pixel region PB.

Figure 22:
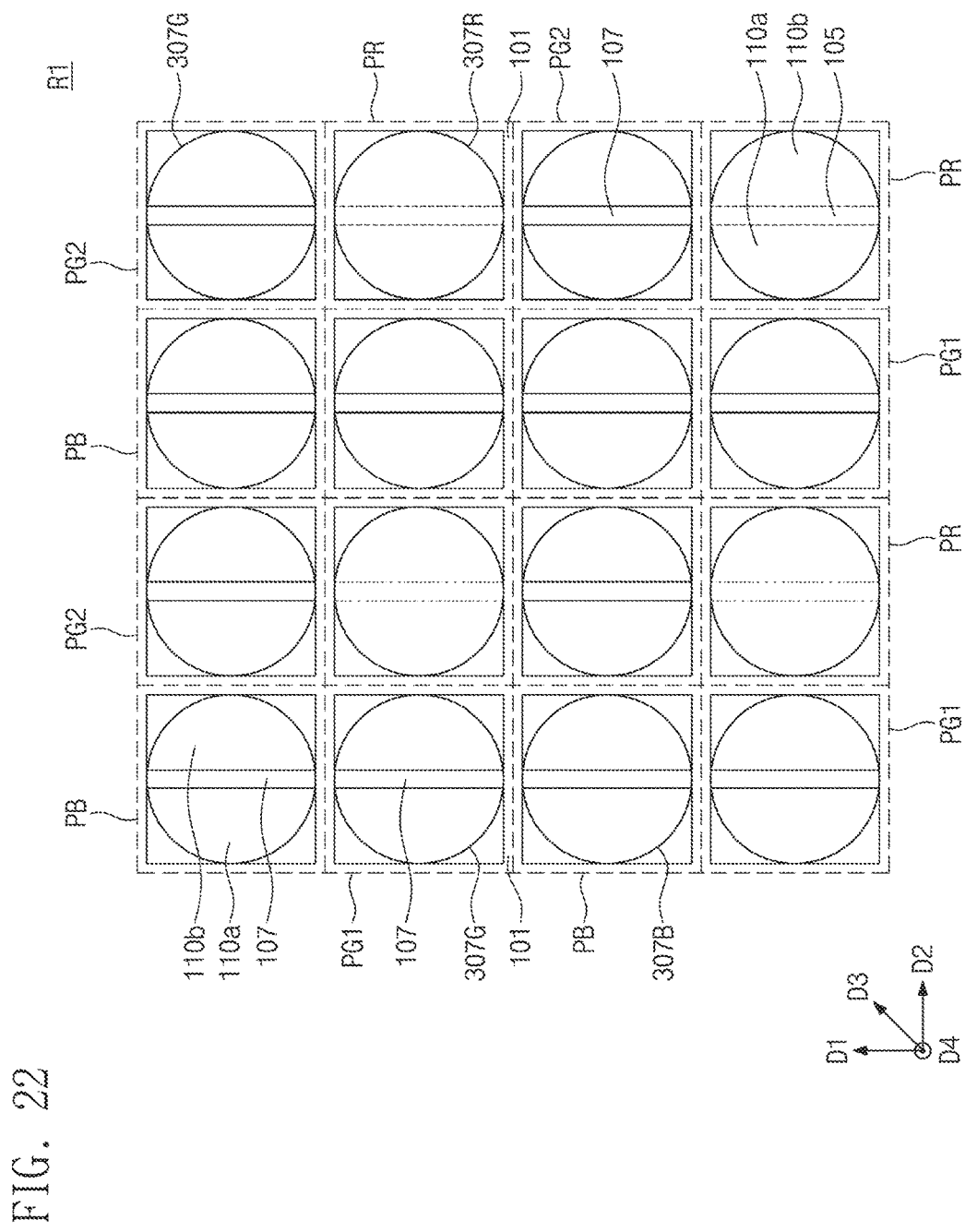
FIGS. 22 and 23 are plan views illustrating an image sensor according to some embodiments of present inventive concepts.
Figure 23:
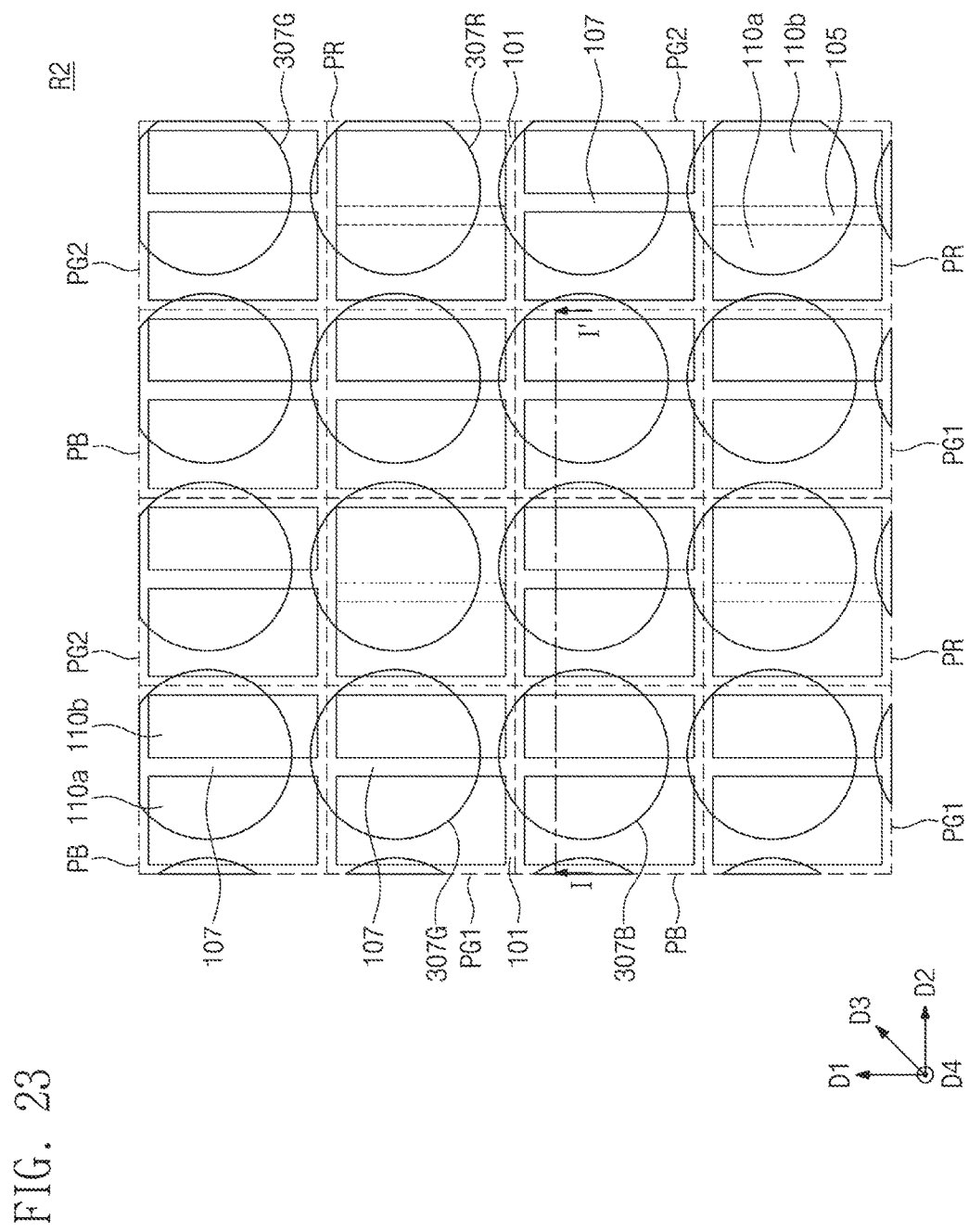
Figure 24:
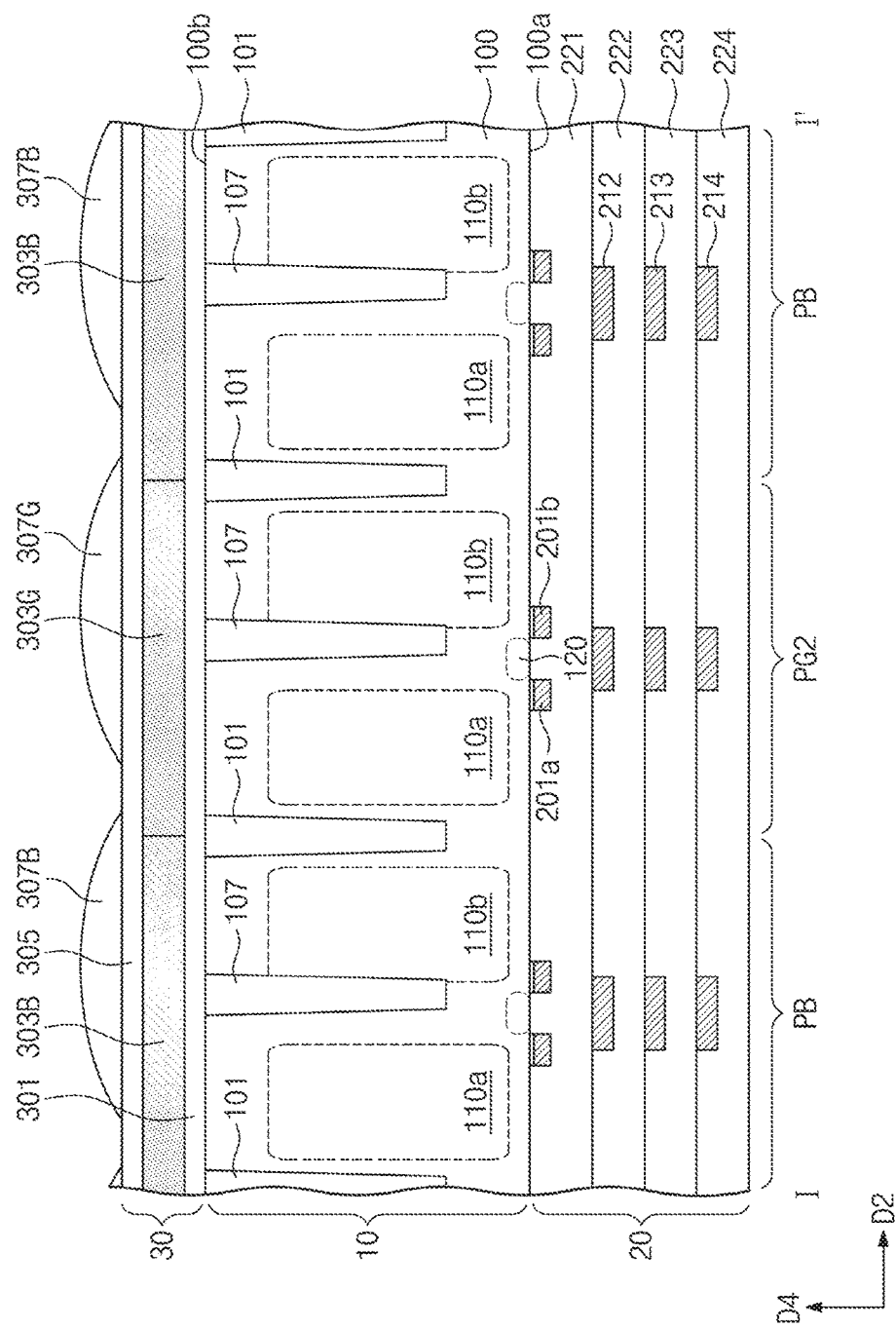
FIG. 24 is a cross-sectional view taken along a line I-I' FIG. 23.

FIGS. 22 and 23 are plan views illustrating an image sensor according to some embodiments of present inventive concepts. FIG. 22 is an enlarged plan view of the first region R1 of FIG. 5A, and FIG. 23 is an enlarged plan view of the second region R2 of FIG. 5A. FIG. 24 is a cross-sectional view taken along a line I-I' FIG. 23. With respect to FIGS. 22-24, the descriptions to the same technical features as in FIGS. 19 to 21 may be omitted or mentioned briefly for the purpose of ease and convenience in explanation. In other words, mainly differences between FIGS. 22-24 and FIGS. 19 to 21 will be described hereinafter.

Referring to FIGS. 22 to 24, like the third pixel regions PB, the third isolation structure 107 may also be disposed in each of the first pixel regions PG1 and PG2. In other words, the third isolation structure 107 extending in the first direction D1 may be disposed in each of the first and third pixel regions PG1, PG2, and PB. In the second region R2, the center of the third isolation structure 107 may be shifted from the center of each of the first and third pixel regions PG1, PG2, and PB.

In the image sensor according to some embodiments of present inventive concepts, the micro lens and the isolation structure may be shifted in the pixel region. Thus, it is possible to reduce the crosstalk phenomenon between the pixel regions adjacent to each other. As a result, it is possible to reduce a noise difference between the pixel regions adjacent to each other.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. An image sensor comprising:
   a semiconductor substrate including a first pixel region and a second pixel region;
   a first isolation structure in the semiconductor substrate to define the first and second pixel regions;
   a first photoelectric conversion element and a second photoelectric conversion element in each of the first and second pixel regions;
   a second isolation structure between the first and second photoelectric conversion elements in the first pixel region; and
   an isolation dopant region between the first and second photoelectric conversion elements in the second pixel region,
   wherein a center of the second isolation structure is shifted relative to a center of the first pixel region when viewed in plan view,
   wherein the first pixel region is one of a plurality of first pixel regions and the second pixel region is one of a plurality of second pixel regions, and
   wherein the first pixel regions and the second pixel regions are alternately arranged along a first direction.

2. The image sensor of claim 1, wherein the second isolation structure comprises: a first portion extending in the first direction; and a second portion extending in a second direction intersecting the first direction.

3. The image sensor of claim 1, wherein the first isolation structure and the second isolation structure are connected to each other to constitute one body.

4. The image sensor of claim 1,
   wherein a width of a top surface of the first isolation structure is wider than a width of a top surface of the second isolation structure, and
   wherein a depth of the first isolation structure is deeper than a depth of the second isolation structure.

5. The image sensor of claim 1,
   wherein a width of the first isolation structure is tapered from a first surface of the semiconductor substrate toward a second surface of the semiconductor substrate, and
   wherein a width of the second isolation structure is tapered from the first surface of the semiconductor substrate toward the second surface of the semiconductor substrate.

6. The image sensor of claim 1,
   wherein the semiconductor substrate further includes a third pixel region defined by the first isolation structure,
   wherein the image sensor further comprises a third isolation structure between first and second photoelectric conversion elements in the third pixel region,
   wherein a center of the third isolation structure is shifted from a center of the third pixel region when viewed in plan view, and
   wherein the third pixel region is spaced apart from the first pixel region in a second direction intersecting the first direction.

7. The image sensor of claim 6, wherein a shifted distance of the second isolation structure is different from a shifted distance of the third isolation structure.

8. The image sensor of claim 1, further comprising:
first and second micro lenses on the first and second pixel regions, respectively,
wherein a center of the first micro lens is shifted from the center of the first pixel region when viewed in plan view, and
wherein a center of the second micro lens is shifted from a center of the second pixel region when viewed in plan view.

9. The image sensor of claim 8, wherein at least a portion of the first micro lens vertically overlaps the second pixel region.

10. The image sensor of claim 8, wherein a shifted distance of the first micro lens is different from a shifted distance of the second micro lens.

11. The image sensor of claim 1,
wherein a center of the semiconductor substrate is spaced apart from the center of the first pixel region in a second direction, and
wherein the second isolation structure is shifted in the second direction.

12. The image sensor of claim 1, further comprising first and second color filters on the first and second pixel regions, respectively,
wherein a center of the first color filter is shifted from the center of the first pixel region when viewed in plan view, and
wherein a center of the second color filter is shifted from a center of the second pixel region when viewed in plan view.

13. The image sensor of claim 1, wherein the isolation dopant region comprises a different shape front the second isolation structure.

14. The image sensor of claim 1,
wherein the second pixel region comprises a red pixel region,
wherein the isolation dopant region is at a center of the red pixel region, and
wherein the first pixel region comprises a green or blue pixel region that is free of the isolation dopant region.

15. The image sensor of claim 1,
wherein the isolation dopant region divides the second pixel region into two regions when viewed in plan view, and
wherein the second isolation structure divides the first pixel region into four regions when viewed in plan view.

16. An image sensor comprising:
a semiconductor substrate comprising: a first pixel region in a first region; and a second pixel region in a second region;
a first isolation structure in the semiconductor substrate to define the first and second pixel regions;
a first photoelectric conversion element and a second photoelectric conversion element in each of the first and second pixel regions;
a second isolation structure between the first and second photoelectric conversion elements in the first pixel region;
a third isolation structure between the first and second photoelectric conversion elements in the second pixel region;
first and second color filters on the first and second pixel regions, respectively; and
a micro lens on the second color filter,
wherein a center of the second isolation structure is substantially aligned with a center of the first color filter when viewed in plan view, and
wherein a center of the third isolation structure and a center of the micro lens are shifted from a center of the second color filter in a same direction when viewed in plan view.

17. The image sensor of claim 16,
wherein a shifted distance of the micro lens is longer than a shifted distance of the third isolation structure,
wherein the first region is at a center of the semiconductor substrate, and
wherein the center of the third isolation structure and the center of the micro lens are shifted in the same direction toward a same quadrant of the second pixel region when viewed in plan view.

18. An image sensor comprising:
a semiconductor substrate comprising a plurality of pixel regions;
first and second photoelectric conversion regions in one of the plurality of pixel regions;
an isolation region extending in the semiconductor substrate between the first and second photoelectric conversion regions in the one of the plurality of pixel regions;
a color filter on the one of the plurality of pixel regions; and
a lens on the color filter and overlapping a center of the isolation region,
wherein the center of the isolation region and a center of the lens are offset from a center of the color filter, and
wherein the center of the isolation region is between the center of the lens and the center of the color filter.

19. The image sensor of claim 18, wherein the lens overlaps a portion of a photoelectric conversion region of another one of the plurality of pixel regions.

20. The image sensor of claim 18, wherein the center of the isolation region is at an intersection of first and second portions of the isolation region that extend in different first and second directions, respectively.

* * * * *